(12) United States Patent
Hwang et al.

(10) Patent No.: US 10,957,242 B2
(45) Date of Patent: *Mar. 23, 2021

(54) DISPLAY PANEL

(71) Applicant: Samsung Display Co., Ltd., Yongin-Si (KR)

(72) Inventors: Jung Hwan Hwang, Cheonan-si (KR); Beom Jun Kim, Seoul (KR); Seong Yeol Syn, Ulsan (KR); Bong-Jun Lee, Seoul (KR); You Mee Hyun, Anyang-si (KR)

(73) Assignee: Samsung Display Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/583,018

(22) Filed: Sep. 25, 2019

(65) Prior Publication Data

US 2020/0020269 A1 Jan. 16, 2020

Related U.S. Application Data

(60) Continuation of application No. 15/417,092, filed on Jan. 26, 2017, now Pat. No. 10,467,946, which is a
(Continued)

(30) Foreign Application Priority Data

Mar. 13, 2013 (KR) .................. 10-2013-0026849

(51) Int. Cl.
*G09G 3/20* (2006.01)
*G09G 3/36* (2006.01)
*G11C 19/28* (2006.01)

(52) U.S. Cl.
CPC ......... *G09G 3/2092* (2013.01); *G09G 3/3648* (2013.01); *G09G 3/3677* (2013.01);
(Continued)

(58) Field of Classification Search
CPC .. G09G 3/2092; G09G 3/3648; G09G 3/3677; G09G 2300/0809; G09G 2300/0286; G11C 19/28
See application file for complete search history.

(56) References Cited

U.S. PATENT DOCUMENTS 8,243,058 B2    8/2012  Lee et al.
9,589,519 B2 *  3/2017  Hwang ............. G09G 3/3648
(Continued)

FOREIGN PATENT DOCUMENTS

CN    102081897 A    6/2011
JP    2007-286452 A   11/2007
(Continued)

*Primary Examiner* — Sahlu Okebato
(74) *Attorney, Agent, or Firm* — Innovation Counsel LLP

(57) ABSTRACT

A display panel is provided. The display panel includes a display area comprising a gate line and a data line, and a gate driver connected to a terminal of the gate line. The gate driver includes a plurality of stages that are integrated on a substrate, and each stage comprises an inverter unit, an output unit, and a Q node stabilization unit. The output unit includes a first transistor and a first capacitor, wherein the first transistor includes an input terminal for receiving a clock signal, a control terminal connected to a node Q, and an output terminal connected to a gate voltage output terminal to output a gate voltage. A Vgs voltage of a transistor in the Q node stabilization unit has a value of equal to or less than 0 V when the output unit outputs a gate-on voltage.

16 Claims, 17 Drawing Sheets

Related U.S. Application Data division of application No. 14/203,272, filed on Mar. 10, 2014, now Pat. No. 9,589,519.

(52) U.S. Cl.
 CPC ..... *G11C 19/28* (2013.01); *G09G 2300/0809* (2013.01); *G09G 2310/0286* (2013.01)

(56) References Cited

U.S. PATENT DOCUMENTS

| | | | |
|---|---|---|---|
| 2005/0270712 A1 | 12/2005 | Huang et al. | |
| 2008/0074379 A1* | 3/2008 | Kim | G09G 3/3677 345/99 |
| 2010/0207928 A1 | 8/2010 | Lee et al. | |
| 2010/0226473 A1 | 9/2010 | Liu et al. | |
| 2011/0122117 A1 | 5/2011 | Lee et al. | |
| 2011/0148853 A1* | 6/2011 | Ko | G11C 19/28 345/213 |
| 2011/0273416 A1 | 11/2011 | Bae et al. | |
| 2011/0316834 A1 | 12/2011 | Lee et al. | |
| 2012/0269316 A1 | 10/2012 | Jang et al. | |

FOREIGN PATENT DOCUMENTS

| | | |
|---|---|---|
| JP | 2009-123252 A | 6/2009 |
| JP | 2010-039190 A | 2/2010 |
| JP | 2011-113096 A | 6/2011 |
| KR | 10-2007-0075829 A | 7/2007 |
| KR | 10-2010-0094613 A | 8/2010 |
| KR | 10-2011-0031748 A | 3/2011 |
| KR | 10-2011-0058396 A | 6/2011 |
| KR | 10-2011-0123097 A | 11/2011 |
| KR | 10-2012-0065788 A | 6/2012 |

\* cited by examiner

FIG. 8

| Von=15V L=7um | High temperature [CLK 100%, 20Hz] | | High temperature [CLK 150%, 20Hz] | Long term reliability |
|---|---|---|---|---|
| | OSG Typical Characteristic | OSG -2V Negative Vth | OSG Typical Characteristic | |
| Exemplary Embodiment of FIG. 3 VSS1 / VSS2 / VSS3 -7V / -11V / -15V | 90% ↑ | 90% ↑ | 90% ↑ | 7.5V PASS [△7.5V] |
| Exemplary Embodiment of FIG. 6 VSS1 / VSS2 / VSS3 -9V / -12V / -15V | 90% ↑ | 90% ↑ | 90% ↑ | 7V PASS [△8V] |
| Comparative example VSS1 / VSS2 -10V / -15V | 90% ↑ | 65%~70% → ASG1 Defect degree | 85% ↑ | 6.5V DOWN [△8.5V] |
| Reference standard | 80% ↑ | 80% ↑ | 80% ↑ | △5V ↑ |

DISPLAY PANEL

CROSS-REFERENCE TO RELATED APPLICATION

This application is a continuation application of U.S. patent application Ser. No. 15/417,092 filed on Jan. 26, 2017, which is a divisional of U.S. patent application Ser. No. 14/203,272 filed Mar. 10, 2014 (now U.S. Pat. No. 9,589,519), which claims priority 35 U.S.C. § 119 to Korean Patent Application No. 10-2013-0026849 filed in the Korean Intellectual Property Office on Mar. 13, 2013, the entire contents of which are incorporated herein by reference.

BACKGROUND

(a) Field

The present disclosure relates to a display panel, and more particularly, a display panel having a gate driver integrated therein.

(b) Description of the Related Art

Liquid crystal panels are widely used in flat display panels. A liquid crystal panel typically includes two display panels on which field generating electrodes (such as pixel electrodes and a common electrode) are formed, and a liquid crystal layer interposed between the two display panels. In the liquid crystal display panel, a voltage is applied to the field generating electrodes so as to form an electric field in the liquid crystal layer. The electric field influences the alignment of liquid crystal molecules in the liquid crystal layer. By manipulating the electric field to control the polarization of incident light through the liquid crystal layer, images can be displayed on the liquid crystal panel.

The liquid crystal panel may further include a gate driver and a data driver. The gate driver may be patterned along with the gate line and data line, and integrated on the panel using thin film transistors. By integrating the gate driver on the panel, savings in manufacturing costs can be realized since an additional (discrete) gate driving chip is not required.

However, in some instances, the thin film transistors in the integrated gate driver may generate a leakage current that can cause the gate-off signal and the gate voltage level to deteriorate.

SUMMARY

The present disclosure addresses at least the above problems relating to leakage current in an integrated gate driver.

According to some embodiments of the inventive concept, a display panel is provided. The display panel includes a display area comprising a gate line and a data line, and a gate driver connected to a terminal of the gate line. The gate driver includes a plurality of stages that are integrated on a substrate, and at least one of the stages includes an inverter unit, an output unit, and a carry signal generator. The output unit includes a first transistor and a first capacitor. The first transistor includes an input terminal for receiving a clock signal, a control terminal connected to a node Q, and an output terminal connected to a gate voltage output terminal to output a gate voltage at a first low voltage. The inverter unit is configured to output voltage at a second low voltage. The carry signal generator is configured to generate a carry signal at a third low voltage, wherein the second low voltage has a lower voltage level than the first low voltage, and the third low voltage has a lower voltage level than the second low voltage.

In some embodiments, each stage may further include a Q node stabilization unit, and a Vgs voltage of a transistor in the Q node stabilization unit may have a value of equal to or less than 0 V when the output unit ouputs a gate-on voltage.

In some embodiments, the Q node stabilization unit may include a fourth transistor comprising an input terminal and a control terminal for receiving a carry signal of a previous stage through a first input terminal, and an output terminal connected to the node Q; a sixth transistor comprising a control terminal for receiving a carry signal of a second next stage through a third input terminal, an input terminal connected to the node Q and an output terminal for receiving the second low voltage; a ninth transistor comprising a control terminal for receiving a carry signal of a next stage through a second input terminal, an input terminal connected to the node Q, and an output terminal for receiving the second low voltage; and a tenth transistor comprising a control terminal connected to a node I wherein the node I corresponds to an output of the inverter unit, an input terminal connected to the node Q, and an output terminal for receiving the second low voltage.

In some embodiments, the Q node stabilization unit may include a fourth transistor comprising an input terminal and a control terminal for receiving a carry signal of a previous stage through a first input terminal, and an output terminal connected to the node Q; a sixth transistor comprising a control terminal for receiving a carry signal of a second next stage through a third input terminal, an input terminal connected to the node Q and an output terminal for receiving the third low voltage; a ninth transistor comprising a control terminal for receiving a carry signal of a next stage through a second input terminal, an input terminal connected to the node Q, and an output terminal for receiving the third low voltage; and a tenth transistor comprising a control terminal connected to a node I wherein the node I corresponds to an output of the inverter unit, an input terminal connected to the node Q, and an output terminal for receiving the second low voltage.

In some embodiments, the Q node stabilization unit may include a fourth transistor comprising an input terminal and a control terminal for receiving a carry signal of a previous stage through a first input terminal, and an output terminal connected to the node Q; a sixth transistor comprising a control terminal for receiving a carry signal of a second next stage through a third input terminal, an input terminal connected to the node Q and an output terminal for receiving the second low voltage; a ninth transistor comprising a control terminal for receiving the second low voltage, an input terminal connected to the node Q, and an output terminal for receiving the third low voltage; and a tenth transistor comprising a control terminal connected to a node I wherein the node I corresponds to an output of the inverter unit, an input terminal connected to the node Q, and an output terminal for receiving the second low voltage.

In some embodiments, the Q node stabilization unit may include a fourth transistor comprising an input terminal and a control terminal for receiving a carry signal of a previous stage through a first input terminal, and an output terminal connected to the node Q; a ninth transistor and a ninth-1 transistor comprising a pair of transistors wherein an input terminal of the ninth-1 transistor and an output terminal of the ninth transistor are connected to each other, control terminals of the pair of transistors are connected to a second input terminal for receiving the carry signal of the next stage through the second input terminal, an input terminal of the ninth transistor is connected to the node Q, and an output terminal of the ninth-1 transistor for receiving the second low voltage; and a tenth transistor and a tenth-1 transistor comprising a pair of transistors wherein an input terminal of the tenth-1 transistor and an output terminal of the tenth transistor are connected to each other, control terminals of the pair of transistors are connected to a node I wherein the node I corresponds to an output of the inverter unit, an input terminal of the tenth transistor is connected to the node Q, and an output terminal of the tenth-1 transistor for receiving the second low voltage.

In some embodiments, a fifth transistor may include an input terminal connected to a node I wherein the node I corresponds to an output of the inverter unit, a control terminal for receiving a carry signal of a previous stage through a first input terminal, and an output terminal for receiving the second low voltage.

In some embodiments, the pull-down unit may include a second transistor and a third transistor for decreasing a voltage of the output terminal of the first transistor of the output unit to the first low voltag.

In some embodiments, the pull-down unit may include an eleventh transistor for decreasing a voltage of the carry signal to the third low voltage, and the eleventh transistor may include a control terminal connected to a node I wherein the node I corresponds to an output of the inverter unit, an input terminal connected to an output terminal of the carry signal generator, and an output terminal for receiving the third low voltage.

In some embodiments, the pull-down unit may include a seventeenth transistor for decreasing a voltage of the carry signal to the third low voltage, and the seventeenth transistor may include a control terminal for receiving the carry signal of the next stage through the second input terminal, an input terminal connected to the output terminal of the carry signal generator, and an output terminal for receiving the third low voltage.

In some embodiments, the pull-down unit may further include an eleventh-1 transistor for decreasing the gate voltage to the first low voltage, and the eleventh-1 transistor may include a control terminal for receiving an output signal of an inverter of a previous stage, an input terminal connected to the output terminal of the first transistor of the output unit, and an output terminal for receiving the first low voltage.

In some embodiments, the pull-down unit may further include an eleventh transistor for decreasing a voltage of the carry signal to the second low voltage, and the eleventh transistor may include a control terminal connected to a node I wherein the node I corresponds to the output of the inverter unit, an input terminal connected to the output terminal of the carry signal generator, and an output terminal for receiving the second low voltage.

In some embodiments, the pull-down unit may further include an eleventh transistor for decreasing a voltage of the carry signal to the first low voltage, and the eleventh transistor may include a control terminal connected to a node I wherein the node I corresponds to the output of the inverter unit, an input terminal connected to the output terminal of the carry signal generator, and an output terminal for receiving the first low voltage.

In some embodiments, a channel of the transistors may include an oxide semiconductor or an amorphous semiconductor, and when a voltage applied to each stage is more than −10 V, either the amorphous semiconductor or the oxide semiconductor may be used to form the channel of the transistors, and when the voltage applied to each stage is less than −10 V, the oxide semiconductor may be used to form the channel of the transistors.

According to some other embodiments of the inventive concept, a display panel is provided. The display panel includes a display area comprising a gate line and a data line, and a gate driver connected to a terminal of the gate line. The gate driver includes a plurality of stages that are integrated on a substrate, and each stage comprises an inverter unit, an output unit, and a Q node stabilization unit. The output unit includes a first transistor and a first capacitor, wherein the first transistor includes an input terminal for receiving a clock signal, a control terminal connected to a node Q, and an output terminal connected to a gate voltage output terminal to output a gate voltage. A Vgs voltage of a transistor in the Q node stabilization unit has a value of equal to or less than 0 V when the output unit outputs a gate-on voltage.

In some embodiments, a channel of the first transistor may include an oxide semiconductor or an amorphous semiconductor, and when a voltage applied to each stage is more than −10 V, either the amorphous semiconductor or the oxide semiconductor may be used to form the channel of the first transistor, and when the voltage applied to each stage is less than −10 V, the oxide semiconductor may be used to form the channel of the first transistor.

In some embodiments, the output unit may be configured to output the gate voltage at a first low voltage, and the inverter unit may be configured to output voltage at a second low voltage, wherein the second low voltage has a lower voltage level than the first low voltage.

In some embodiments, each stage may further include a carry signal generator configured to generate and output a carry signal at a third low voltage, wherein the third low voltage has a lower voltage level than the second low voltage.

In some embodiments, the Q node stabilization unit may include a fourth transistor comprising an input terminal and a control terminal for receiving a carry signal of a previous stage through a first input terminal, and an output terminal connected to the node Q; a sixth transistor comprising a control terminal for receiving a carry signal of a second next stage through a third input terminal, an input terminal connected to the node Q and an output terminal for receiving the second low voltage; a ninth transistor comprising a control terminal for receiving a carry signal of a next stage through a second input terminal, an input terminal connected to the node Q, and an output terminal for receiving the second low voltage; and a tenth transistor comprising a control terminal connected to a node I wherein the node I corresponds to an output of the inverter unit, an input terminal connected to the node Q, and an output terminal for receiving the second low voltage.

In some embodiments, the Q node stabilization unit may include a fourth transistor comprising an input terminal and a control terminal for receiving a carry signal of a previous stage through a first input terminal, and an output terminal connected to the node Q; a sixth transistor comprising a control terminal for receiving a carry signal of a second next stage through a third input terminal, an input terminal connected to the node Q and an output terminal for receiving the third low voltage; a ninth transistor comprising a control terminal for receiving a carry signal of a next stage through a second input terminal, an input terminal connected to the node Q, and an output terminal for receiving the third low voltage; and a tenth transistor comprising a control terminal connected to a node I as an output of the inverter unit, an input terminal connected to the node Q, and an output terminal for receiving the second low voltage.

BRIEF DESCRIPTION OF THE DRAWINGS

FIGS. 7 and 8 are tables showing the output characteristics of exemplary gate drivers under different operating conditions.

DETAILED DESCRIPTION

Figure 1:
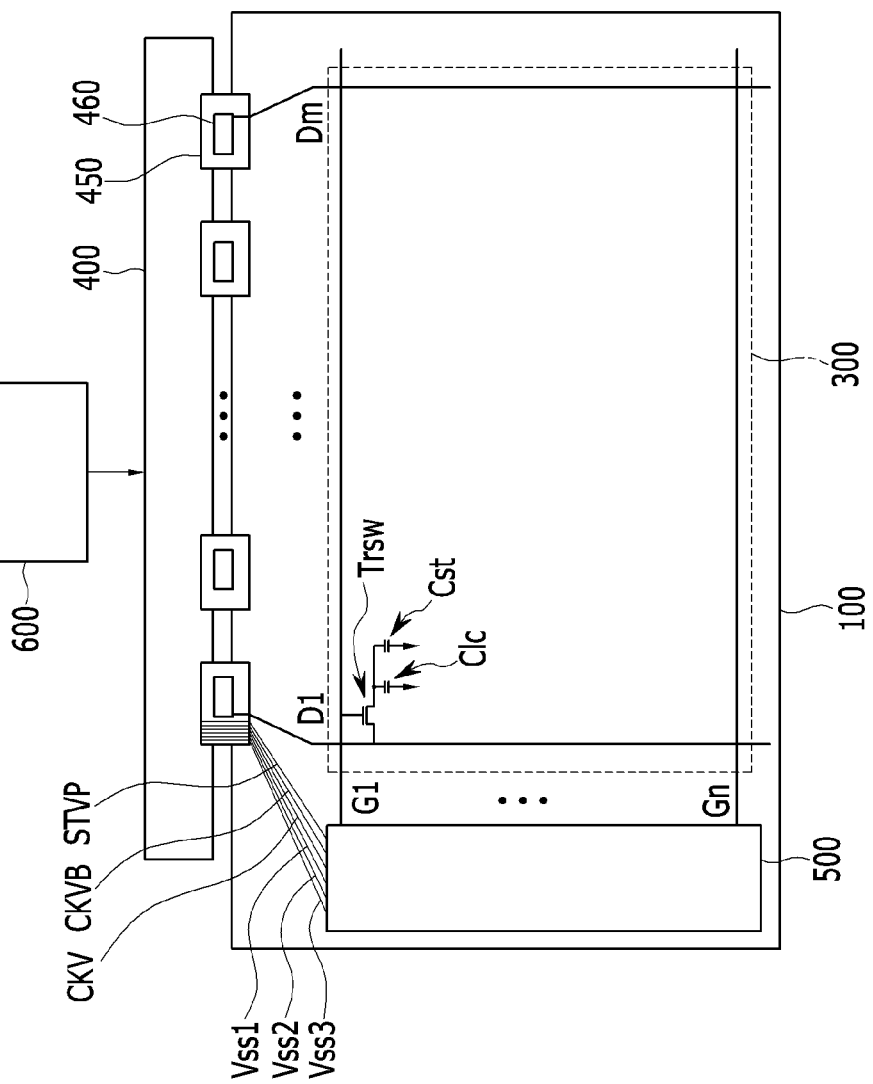
FIG. 1 is a top plan view of a display panel according to an exemplary embodiment of the inventive concept.

The inventive concept will be described more fully hereinafter with reference to the accompanying drawings, in which exemplary embodiments are shown. As those skilled in the art would realize, the embodiments may be modified in various ways without departing from the spirit or scope of the present disclosure.

In the drawings, the thickness of layers, films, panels, regions, etc., may be exaggerated for clarity. Like reference numerals designate like elements throughout the specification. It will be understood that when an element such as a layer, film, region, or substrate is described as being "on" another element, the element may be disposed on the other element with or without any intervening element(s). In contrast, when an element is described as being "directly on" another element, there are no intervening elements present.

First, a display panel according to an exemplary embodiment of the inventive concept will be described with reference to FIG. 1.

FIG. 1 is a top plan view of an exemplary display panel.

Referring to FIG. 1, a display panel 100 includes a display area 300 for displaying images. The display area 300 includes a plurality of gate lines G1-Gn and a plurality of data lines D1-Dm. The plurality of gate lines G1-Gn and the plurality of data lines D1-Dm intersect each other, and are insulated from each other by one or more intervening dielectric layers.

The display panel 100 also includes a gate driver 500 and a data driver IC 460. The gate driver 500 is configured to apply a gate voltage to a gate line of the display area 300. The data driver IC 460 is configured to apply a data voltage to a data line of the display area 300. In some embodiments, the data driver IC 460 may be formed on a film (e.g., a flexible printed circuit (FPC) film 450) that is attached to the display panel 100, as shown in FIG. 1.

The gate driver 500 and the data driver IC 460 are controlled by a signal controller 600. In some embodiments, the signal controller 600 is provided as a discrete external unit. In some embodiments, the signal controller 600 may be formed on a printed circuit board (PCB) 400. When the flexible printed circuit film (FPC) 450 is connected to the printed circuit board (PCB) 400, signals from the signal controller 600 can be transmitted to the data driver IC 460 and the gate driver 500. The signals transmitted from the signal controller 600 may include a first clock signal CKV, a second clock signal CKVB, a scan start signal STVP, and a signal providing low voltages Vss1, Vss2, and Vss3 of a predetermined voltage level. In an exemplary embodiment, the low voltages may include three or more different voltage levels.

In the example of FIG. 1, the display area 300 constitutes part of a liquid crystal panel. It should be noted that the inventive concept is not limited to a liquid crystal panel. For example, in some other embodiments, an exemplary display panel may include an organic light emitting panel, a plasma display panel, or an electrophoretic display panel. In those other embodiments, a display area 300 for an organic light emitting panel may include a thin film transistor and an organic light emitting diode; and a display area 300 for the other types of display panels (e.g., plasma or electrophoretic display panels) may include elements such as thin film transistors.

Referring to FIG. 1, the display area 300 includes a plurality of pixels PX formed by the intersecting gate lines G1-Gn and data lines D1-Dm. Each pixel PX includes a thin film transistor Trsw, a liquid crystal capacitor Clc, and a storage capacitor Cst. A control terminal of the thin film transistor Trsw is connected to a gate line. An input terminal of the thin film transistor Trsw is connected to a data line. An output terminal of the thin film transistor Trsw is connected to a terminal of the liquid crystal capacitor Clc and a terminal of the storage capacitor Cst. The other terminal of the liquid crystal capacitor Clc is connected to a common electrode. A storage voltage Vcst (not shown) from the signal controller 600 is applied to the other terminal of the storage capacitor Cst. It should be noted that the structure of the pixel PX is not limited to the above-described embodiment. For example, one of ordinary skill would appreciate that the structure of the pixel PX of the liquid crystal panel may include other embodiments and can be modified in different ways.

As mentioned previously, the plurality of data lines D1-Dm receive the data voltage from the data driver IC 460, and the plurality of gate lines G1-Gn receive the gate voltage from the gate driver 500.

The data driver IC 460 may be positioned on either the upper side or lower side portions of the display panel 100. In the example of FIG. 1, the data driver IC 460 is positioned on the upper side portion of the display panel 100, and is connected to the data lines D1-Dm extending vertically upwards across the display area 300.

The gate driver 500 receives clock signals CKV and CKVB, a scan start signal STVP, and low voltages Vss1, Vss2, and Vss3. The first low voltage Vss1 corresponds to a gate-off voltage. The second low voltage Vss2 and third low voltage Vss3 typically have lower voltage levels than the gate-off voltage. Based on the low voltages Vss1, Vss2, and Vss3, the gate driver 500 generates a gate voltage (which includes a gate-on voltage and a gate-off voltage), and sequentially applies the gate-on voltage to the gate lines G1-Gn.

Referring to FIG. 1, the clock signals CKV and CKVB, scan start signal STVP, and low voltages Vss1, Vss2, and Vss3 are applied to the gate driver 500 through the portion of the flexible printed circuit film 450 that is positioned closest to the gate driver 500. The above signals may be transmitted to the gate driver 500 from either an external source or the signal controller 600, via the flexible printed circuit film 450 connected to the printed circuit board (PCB) 400.

Next, the gate driver 500 and the gate lines G1-Gn will be described with reference to FIG. 2.

Figure 2:
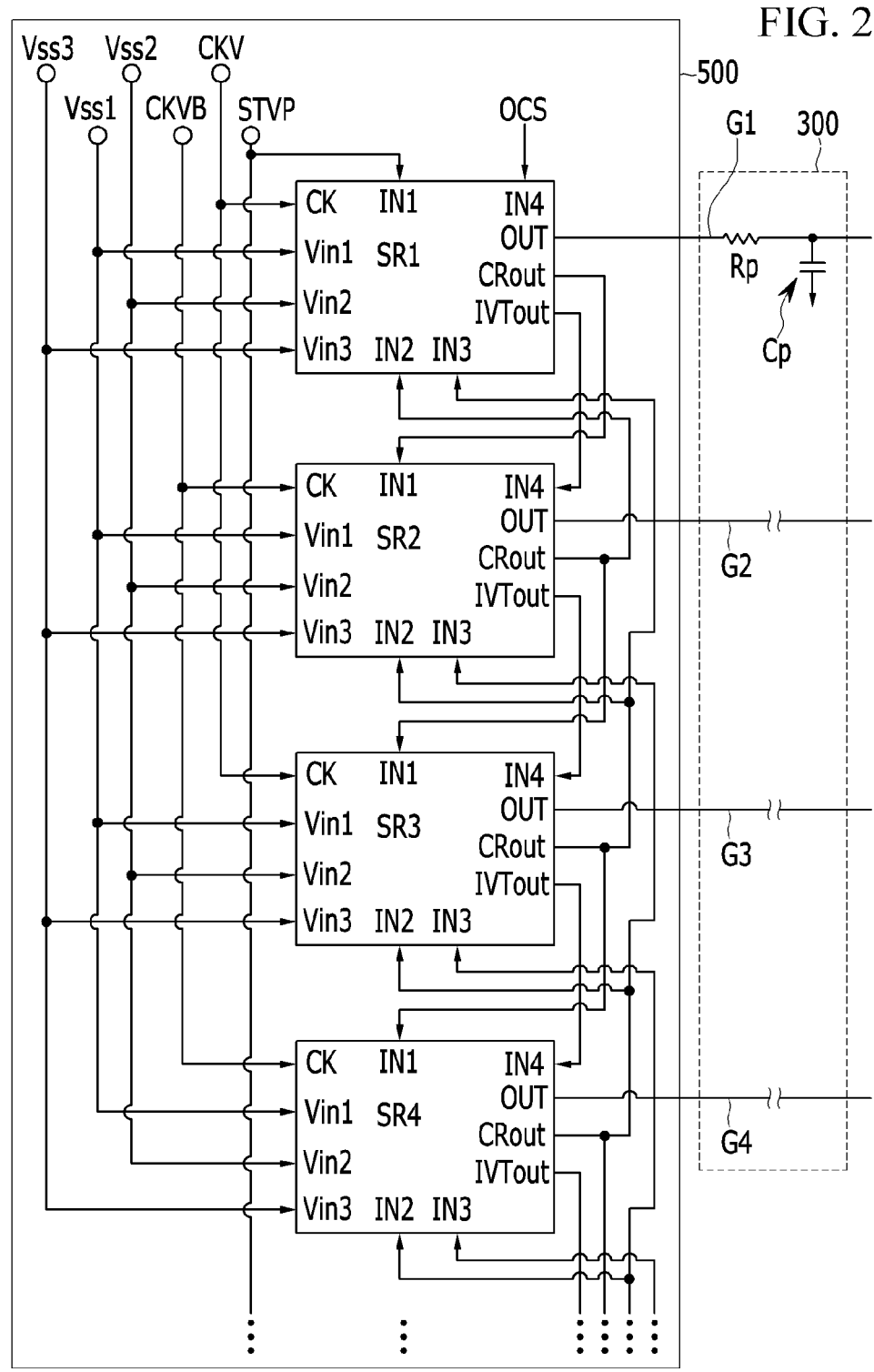
FIG. 2 is a block diagram of the gate driver and gate lines of FIG. 1.

FIG. 2 shows a block diagram of the gate driver 500 and gate lines G1-Gn of FIG. 1.

Referring to FIG. 2, the display area 300 is depicted by a plurality of resistors Rp and a plurality of capacitors Cp. The gate lines G1-Gn, liquid crystal capacitors Clc, and storage capacitors Cst have resistances and capacitances, and the sum of the resistances and capacitances for each gate line can be represented as a single resistance value and a single capacitance value. As shown in FIG. 2, each gate line can be represented as a resistor Rp and a capacitor Cp in a circuit diagram. The values of the resistances Rp and capacitances Cp of the gate lines may change depending on the structure and electrical characteristics of the display area 300. As described below, the gate voltage output from each stage SR in the gate driver 500 is transmitted to the respective gate line.

The gate driver 500 includes a plurality of stages SR1, SR2, SR3, SR4, . . . that are connected to one another. As shown in FIG. 2, each stage includes four input terminals IN1, IN2, IN3, and IN4; a clock input terminal CK; three voltage input terminals Vin1, Vin2, and Vin3; a gate voltage output terminal OUT to output the gate voltage; a carry signal output terminal CRout; and an inverter signal output terminal IVTout.

The first input terminal IN1 of a stage is connected to the carry signal output terminal CRout of the previous stage, so as to receive the carry signal CR of the previous stage. However, since the first stage SR1 does not have a previous stage, the scan start signal STVP is applied to the first input terminal IN1 of the first stage SR1.

The second input terminal IN2 of a stage is connected to the carry signal output terminal CRout of the next stage, so as to receive the carry signal CR of the next stage.

The third input terminal IN3 of a stage is connected to the carry signal output terminal CRout of the second next stage, so as to receive the carry signal CR of the second next stage.

In some embodiments (not shown), the gate driver 500 may include a stage SR(n−1) connected to the (n−1)-th gate line G(n−1) and a stage SRn connected to the n-th gate line Gn. The gate driver 500 may further include two dummy stages SR(n+1) and SR(n+2), such that the stages SR(n−1) and SRn can receive the carry signal CR from the next stage and the second next stage. For example, the second input terminal IN2 of the stage SRn is connected to the carry signal output terminal CRout of the SR(n+1) stage, so as to receive the carry signal CR of the SR(n+1) stage. The third input terminal IN3 of the stage SRn is connected to the carry signal output terminal CRout of the SR(n+2) stage, so as to receive the carry signal CR of the SR(n+2) stage. The dummy stages SR(n+1) and SR(n+2) are stages that generate and output a dummy gate voltage that is different from the gate voltage outputs of the stages SR1-SRn. As mentioned previously, the gate voltage outputs from the stages SR1-SRn are transmitted through the gate lines, and data voltages are then applied to the pixels for the display of images. However, the dummy stages SR(n+1) and SR(n+2) are not connected to the gate lines, and therefore do not contribute to the display of images. In some particular embodiments, even though the dummy stages are connected to the gate lines, the dummy stages are connected to the gate lines of dummy pixels (not shown) that are not used for image display.

Referring to FIG. 2, the fourth input terminal IN4 of a stage is connected to the inverter signal output terminal IVTout of the previous stage, so as to receive the inverter signal IVT of the previous stage. However, since the first stage SR1 does not have a previous stage, a signal corresponding to an inverter signal IVT may be separately generated and applied to the first stage SR1. In some embodiments, the dummy stages SR(n+1) and SR(n+2) (not shown) may generate a signal (having the same relative timing as the other stages) and transmit the signal to the first stage SR1. In the example of FIG. 2, this signal to the fourth input terminal IN4 of the first stage SR1 may be called as an output control signal OCS, which corresponds to a timing signal for one of low voltages Vss1, Vss2, and Vss3.

A clock signal is applied to the clock terminals CK. Specifically, a first clock signal CKV is applied to the clock terminals CK of the odd-numbered stages, and a second clock signal CKVB is applied to the clock terminals CK of the even-numbered stages. In some embodiments, the first clock signal CKV and the second clock signal CKVB are opposite in phase.

The low voltages Vss1, Vss2, and Vss3 are applied to the voltage input terminals Vin1, Vin2, and Vin3, respectively. Specifically, the first low voltage Vss1 corresponding to the gate-off voltage is applied to the first voltage input terminal Vin1. The second low voltage Vss2 (that has a lower voltage level than the first low voltage Vss1) is applied to the second voltage input terminal Vin2. The third low voltage Vss3 (that has a lower voltage level than the second low voltage Vss2) is applied to the third voltage input terminal Vin3. The values of the first low voltage Vss1, second low voltage Vss2 and third low voltage Vss3 may be varied accordingly in different embodiments.

The operation of the gate driver 500 is next described.

First, the first stage SR1 receives the first clock signal CKV from an external source through the clock input terminal CK. The scan start signal STVP is provided to the first input terminal IN1 of the first stage SR1. The first to third low voltages Vss1, Vss2, and Vss3 are provided to the first to third voltage input terminals Vin1, Vin2, and Vin3 of the first stage SR1, respectively. The carry signals CR from the carry signal output terminal CRout of the second stage SR2 are provided to the second input terminal IN2 of the first stage SR1. The carry signals CR from the carry signal output terminal CRout of the third stage SR3 are provided to the third input terminal IN3 of the first stage SR1. The output control signal OCS is provided to the fourth input terminal IN4 of the first stage SR1, such that the gate-on voltage is output to the first gate line G1 through the gate voltage output terminal OUT of the first stage SR1. The carry signal output terminal CRout of the first stage SR1 outputs the carry signal CR to the first input terminal IN1 of the second stage SR2. The inverter signal output terminal IVTout of the first stage SR1 transmits the inverter signal IVT to the fourth input terminal IN4 of the second stage SR2.

The second stage SR2 receives the second clock signal CKVB from the external source through the clock input terminal CK. The first input terminal IN1 of the second stage SR2 receives the carry signal CR from the carry signal output terminal CRout of the first stage SR1. The first to third low voltages Vss1, Vss2, and Vss3 are provided to the first to third voltage input terminals Vin1, Vin2, and Vin3 of the second stage SR2, respectively. The carry signals CR from the carry signal output terminal CRout of the third stage SR3 are provided to the second input terminal IN2 of the second stage SR2. The carry signals CR from the carry signal output terminal CRout of the fourth stage SR4 are provided to the third input terminal IN3 of the second stage SR2. The fourth input terminal IN4 of the second stage SR2 receives the inverter signal IVT from the inverter signal output terminal IVTout of the first stage SR1, such that the gate-on voltage is output to the second gate line G2 through the gate voltage output terminal OUT of the second stage SR2. The carry signal CR from the carry signal output terminal CRout of the second stage SR2 is provided to the first input terminal IN1 of the third stage SR3 and the second input terminal IN2 of the first stage SR1. The inverter signal output terminal IVTout of the second stage SR2 transmits the inverter signal IVT to the fourth input terminal IN4 of the third stage SR3.

The third stage SR3 receives the first clock signal CKV from the external source through the clock input terminal CK. The first input terminal IN1 of the third stage SR3 receives the carry signal CR from the carry signal output terminal CRout of the second stage SR2. The first to third low voltages Vss1, Vss2, and Vss3 are provided to the first to third voltage input terminals Vin1, Vin2, and Vin3 of the third stage SR3, respectively. The carry signals CR from the carry signal output terminal CRout of the fourth stage SR4 are provided to the second input terminal IN2 of the third stage SR3. The carry signals CR from the carry signal output terminal CRout of the fifth stage SR5 (not shown) are provided to the third input terminal IN3 of the third stage SR3. The fourth input terminal IN4 of the third stage SR3 receives the inverter signal IVT from the inverter signal output terminal IVTout of the second stage SR2, such that the gate-on voltage is output to the third gate line G3 through the gate voltage output terminal OUT of the third stage SR3. The carry signal CR from the carry signal output terminal CRout of the third stage SR3 is provided to the first input terminal IN1 of the fourth stage SR4, the second input terminal IN2 of the second stage SR2, and the third input terminal IN3 of the first stage SR1. The inverter signal output terminal IVTout of the third stage SR3 transmits the inverter signal IVT to the fourth input terminal IN4 of the fourth stage SR4.

Consistent with the above, the n-th stage SRn receives the second clock signal CKVB from the external source through the clock input terminal CK. The first input terminal IN1 of the n-th stage SRn receives the carry signal CR from the carry signal output terminal CRout of the (n−1)-th stage SR(n−1). The first to third low voltages Vss1, Vss2, and Vss3 are provided to the first to third voltage input terminals Vin1, Vin2, and Vin3 of the n-th stage SRn, respectively. The carry signals CR from the carry signal output terminal CRout of the (n+1)-th stage SR(n+1) (dummy stage) are provided to the input terminal IN2 of the n-th stage SRn. The carry signals CR from the carry signal output terminal CRout of the (n+2)-th stage SR(n+2) (dummy stage) are provided to the third input terminal IN3 of the n-th stage SRn. The fourth input terminal IN4 of the n-th stage SRn receives the inverter signal IVT from the inverter signal output terminal IVTout of the (n−1)-th stage SR(n−1), such that the gate-on voltage is output to the n-th gate line Gn through the gate voltage output terminal OUT of the n-th stage SRn. The carry signal CR from the carry signal output terminal CRout of the n-th stage SRn is provided to the first input terminal IN1 of the (n+1)-th stage SR(n+1) (dummy stage), the second input terminal IN2 of the (n−1)-th stage SR(n−1), and the third input terminal IN3 of the (n−2)-th stage (SRn−2). The inverter signal output terminal IVTout of the n-th stage SRn transmits the inverter signal IVT to the fourth input terminal IN4 of the (n+1)-th stage SR(n+1) (dummy stage).

The connections between the stages SR of the gate driver 500 has been described above with reference to FIG. 2. Next, the circuit layout of a stage SR will be described in further detail with reference to FIG. 3.

Figure 3:
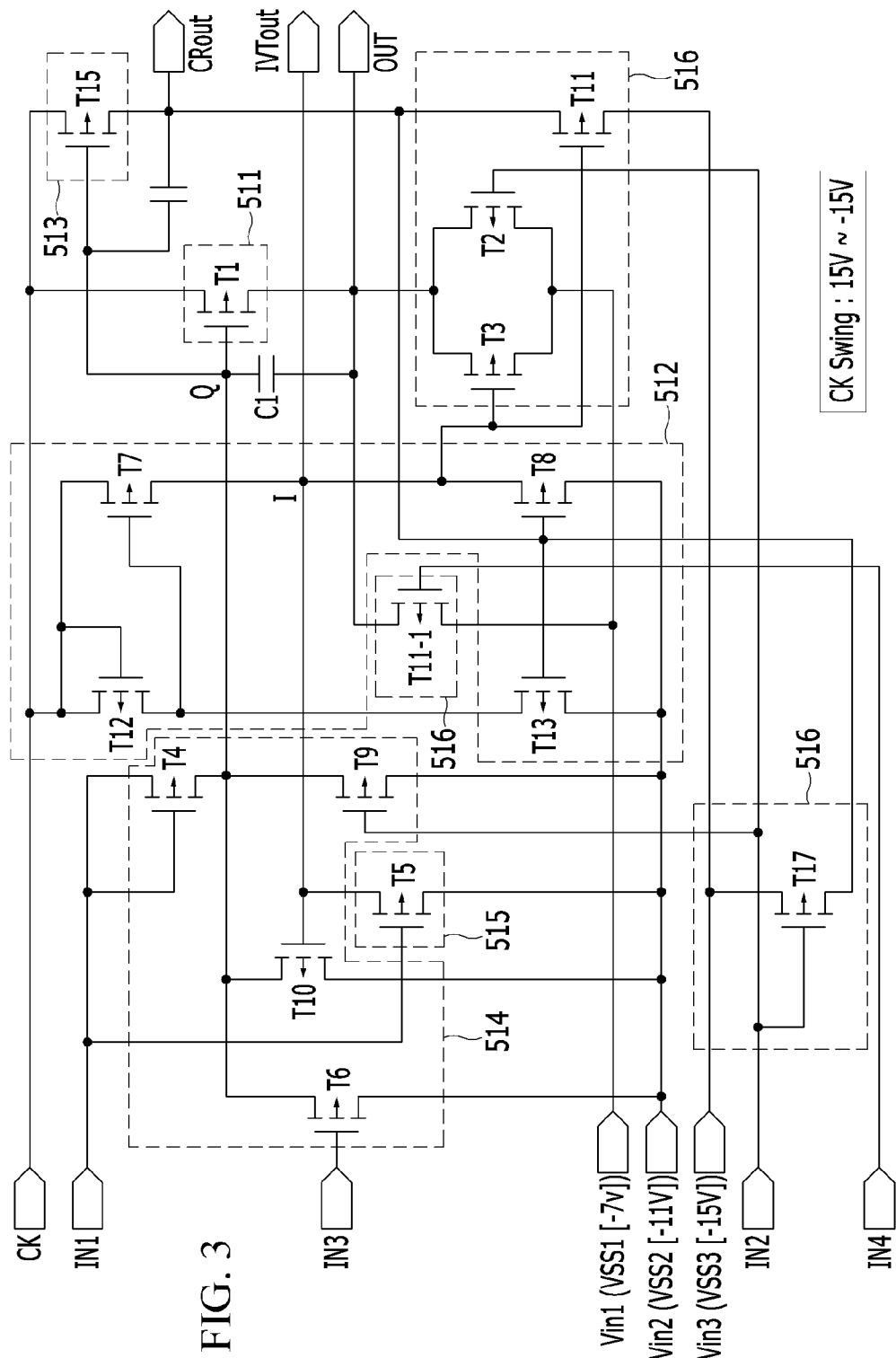
FIG. 3 is a circuit diagram of a stage in a gate driver according to an exemplary embodiment of the inventive concept.

FIG. 3 is a circuit diagram of a stage in a gate driver according to an exemplary embodiment of the inventive concept.

Referring to FIG. 3, a stage SR of the gate driver 500 includes an output unit 511, an inverter unit 512, a carry signal generator 513, a Q node stabilization unit 514, an I node stabilization unit 515, and a pull-down unit 516.

The output unit 511 includes a transistor (e.g., first transistor T1) and a capacitor (e.g., first capacitor C1). The control terminal of the first transistor T1 is connected to a node Q (hereinafter referred to as the first node). The input terminal of the first transistor T1 receives the first clock signal CKV or the second clock signal CKVB through the clock terminal CK. The first capacitor C1 is formed between the control terminal and the output terminal of the first transistor T1. The output terminal of the first transistor T1 is connected to the gate voltage output terminal OUT. The output terminal of the first transistor T1 is also connected to the pull-down unit 516. Specifically, the output terminal of the first transistor T1 is connected to the first voltage input terminal Vin1 through the pull-down unit 516. As a result, the value of the gate-off voltage corresponds to the first low voltage Vss1. The output unit 511 outputs the gate voltage according to the voltage of the node Q and the first clock signal CKV. A voltage difference is generated between the control terminal and the output terminal of the first transistor T1 by the voltage of the node Q. If charge from the voltage difference is stored in the first capacitor C1 and a high voltage is subsequently applied through the clock signal, the high voltage will be output as the gate-on voltage so long as the first capacitor C1 is charged.

Referring to FIG. 3, the inverter unit 512 includes four transistors (twelfth transistor T12, seventh transistor T7, eighth transistor T8, and thirteenth transistor T13). The input terminal and the control terminal of the twelfth transistor T12 are connected together by a diode connection that is connected to the clock input terminal CK. The output terminal of the twelfth transistor T12 is connected to the control terminal of the seventh transistor T7 and the input terminal of the thirteenth transistor T13. The input terminal of the seventh transistor T7 is connected to the clock input terminal CK, and the output terminal of the seventh transistor T7 is connected to a node I (referred to as the inverter node or the second node). As mentioned above, the control terminal of the seventh transistor T7 is connected to the output terminal of the twelfth transistor T12. The control terminal of the eighth transistor T8 is connected to the transmitting signal output terminal CRout of the current stage. The input terminal of the eighth transistor T8 is connected to the node I, and the output terminal of the eighth transistor T8 is connected to the second voltage input terminal Vin2. As mentioned above, the input terminal of the thirteenth transistor T13 is connected to the output terminal of the twelfth transistor T12. The control terminal of the thirteenth transistor T13 is connected to the transmitting signal output terminal CRout of the current stage. The output terminal of the thirteenth transistor T13 is connected to the second voltage input terminal Vin2. A clock signal is transmitted to the input terminals of the eighth and thirteenth transistors T8 and T13 by the twelfth and seventh transistors T12 and T7. If the clock signal is applied with a high voltage, the node I will be at high voltage. However, the transmitted high voltage signal will reduce the voltage of the node I to the second low voltage VSS2 when the transmitting signal output terminal CRout of the current stage outputs the transmitting signal CR. As a result, the node I of the inverter unit 512 has a reverse voltage level with respect to the transmitting signal CR of the current stage and the gate-on voltage.

Referring to FIG. 3, the carry signal generator 513 includes a transistor (fifteenth transistor T15). The input terminal of the fifteenth transistor T15 is connected to the clock terminal CK, so as to receive the first clock signal CKV or second clock signal CKVB. The control terminal of the fifteenth transistor T15 is connected to the control terminal of the input section 511 (first transistor T1) via node Q. The output terminal of the fifteenth transistor T15 is connected to the carry signal output terminal CRout that outputs the carry signal CR. In some embodiments, a parasitic capacitance (not shown) may be formed between the control terminal and the output terminal of the fifteenth transistor T15. The output terminal of the fifteenth transistor T15 is also connected to the eleventh transistor T11 and the seventeenth transistor T17 of the pull-down unit 516, thereby receiving the third low voltage Vss3. As a result, when the carry signal CR is low, the voltage of the carry signal CR corresponds to the third low voltage Vss3.

Referring to FIG. 3, the Q node stabilization unit 514 includes four transistors (fourth transistor T4, sixth transistor T6, ninth transistor T9, and tenth transistor T10). The input terminal and the control terminal of the fourth transistor T4 are commonly connected (diode-connected) to the first input terminal IN1, and the output terminal of the fourth transistor T4 is connected to the node Q. The fourth transistor T4 transmits the high voltage to the node Q when the first input terminal IN1 is applied with the high voltage. The control terminal of the sixth transistor T6 is connected to the third input terminal IN3. The input terminal of the sixth transistor T6 is connected to the node Q and the output terminal of the sixth transistor T6 is connected to the second voltage input terminal Vin2. The sixth transistor T6 changes the voltage of the node Q to the second low voltage Vss2 when the carry signal CR of the second next stage is applied with the high voltage. The control terminal of the ninth transistor T9 is connected to the second input terminal IN2. The input terminal of the ninth transistor T9 is connected to the node Q, and the output terminal of the ninth transistor T9 is connected to the second voltage input terminal Vin2. As a result, when the carry signal CR of the next stage is applied with the high voltage, the voltage of the node Q corresponds to the second low voltage Vss2. The control terminal of the tenth transistor T10 is connected to the node I. The input terminal of the tenth transistor T10 is connected to the node Q, and the output terminal of the tenth transistor T10 is connected to the second voltage input terminal Vin2. The tenth transistor T10 changes the voltage of the node Q to the second low voltage Vss2 via the high voltage output of the inverter unit 512. The voltage of the node Q is stabilized in each time period by the fourth transistor T4, sixth transistor T6, ninth transistor T9, and tenth transistor T10 connected to the node Q.

Referring to FIG. 3, the I node stabilization unit 515 includes a transistor (fifth transistor T5). The input terminal of the fifth transistor T5 is connected to the node I. The control terminal of the fifth transistor T5 is connected to the first input terminal IN1, and the output terminal of the fifth transistor T5 is connected to the second voltage input terminal Vin2. The fifth transistor T5 reduces the voltage of the node I to the second low voltage Vss2 when the high voltage is applied to the first input terminal IN1.

The pull-down unit 516 includes five transistors (second transistor T2, third transistor T3, eleventh transistor T11, eleventh-1 transistor T11-1, and seventeenth transistor T17) connected to the output unit 511 and output terminal of the carry signal generator 513. The control terminal of the second transistor T2 is connected to the second input terminal IN2. The input terminal of the second transistor T2 is connected to the gate voltage output terminal OUT, and the output terminal of the second transistor T2 is connected to the first voltage input terminal Vin1. The second transistor T2 changes the voltage of the gate voltage output terminal OUT to the first low voltage Vss1 according to the transmitting signal CR of the next stage. The control terminal of the third transistor T3 is connected to the node I. The input terminal of the third transistor T3 is connected to the gate voltage output terminal OUT, and the output terminal of the third transistor T3 is connected to the first voltage input terminal Vin1. The third transistor T3 changes the voltage of the gate voltage output terminal OUT to the first low voltage Vss1 according to the voltage of the node I. The control terminal of the eleventh transistor T11 is connected to the node I. The input terminal of the eleventh transistor T11 is connected to the carry signal output terminal CRout, and the output terminal of the eleventh transistor T11 is connected to the third voltage input terminal Vin3. The eleventh transistor T11 changes the voltage of the carry signal output terminal CRout to the third low voltage Vss3 according to the voltage of the node I. The control terminal of the eleventh-1 transistor T11-1 is connected to the fourth input terminal IN4. The input terminal of the eleventh-1 transistor T11-1 is connected to the gate voltage output terminal OUT, and the output terminal of the eleventh-1 transistor T11-1 is connected to the first voltage input terminal Vin1. The eleventh-1 transistor T11-1 changes the gate voltage to the first low voltage Vss1 when the inverter output signal of the previous stage is applied with the high voltage. The control terminal of the seventeenth transistor T17 is connected to the second input terminal IN2. The input terminal of the seventeenth transistor T17 is connected to the carry signal output terminal CRout, and the output terminal of the seventeenth transistor T17 is connected to the third voltage input terminal Vin3. The seventeenth transistor T17 changes the voltage of the carry signal output terminal CRout to the third low voltage Vss3 according to the carry signal of the next stage. The low voltages Vss1, Vss2, and Vss3, clock signal voltage, gate voltage value, and value of the carry signal may have different voltages. For example, in some embodiments, the first low voltage Vss1 is −7 V, the second low voltage Vss2 is −11 V, the third low voltage Vss3 is −15 V, and the voltage of the clock signal is between 15 V and −15 V. The gate-on voltage can have different voltage values depending on the characteristics of the output unit 511. The gate-off voltage corresponds to the first low voltage Vss1. The high voltage of the carry signal can have different values depending on the characteristic of the carry signal generator 513. The low voltage corresponds to the third low voltage Vss3.

Next, the operation of the stage in FIG. 3 will be described.

The carry signal generator 513 and the output unit 514 are operated based on the voltage of the node Q, such that a stage SR outputs the high voltage of the carry signal CR and the gate-on voltage. The carry signal CR is reduced from the high voltage to the third low voltage Vss3 based on the output of the inverter unit 512 of the current stage and the carry signal CR of the next stage. The gate-on voltage is reduced from the high voltage to the first low voltage Vss1 (or gate-off voltage) based on the output of the inverter unit 512 of the current stage and the carry signals CR of the next stage and the second next stage.

The Q node stabilization unit 514 and the I node stabilization unit 515 stabilize the voltages at the node Q and the node I, respectively, as the gate voltage and the carry signal CR are periodically changed.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −4 V, the Vgs of the ninth transistor T9 is −4 V, and the Vgs of the tenth transistor T10 is 0 V. Also, the Vgs of the eighth transistor T8 connected to the output terminal in the inverter unit 512 is −4 V.

As shown above, the Vgs of the fourth transistor T4, the sixth transistor T6, the ninth transistor T9 and the tenth transistor T10 have a value of equal to or less than 0 V, so as to generate and output the gate-on voltage in the corresponding stage. Since there is no increase in leakage current, the voltage of the node Q may be maintained at a constant level. As a result, the voltage of the node Q is stabilized.

The transistors in each stage may be formed in the same process as the thin film transistor Trsw of FIG. 1. In other words, the transistors in each stage may be formed together with the plurality of pixels in the display area 300. The semiconductor material that is used to form the channel of the thin film transistor Trsw and the transistors of each stage may include amorphous silicon or an oxide semiconductor such as IGZO. However, the two semiconductor materials (amorphous silicon and oxide semiconductor) have different electrical characteristics and process requirements. As a result, if IGZO oxide semiconductor is included in the transistors of FIG. 3, amorphous silicon may not be used.

Figure 4:
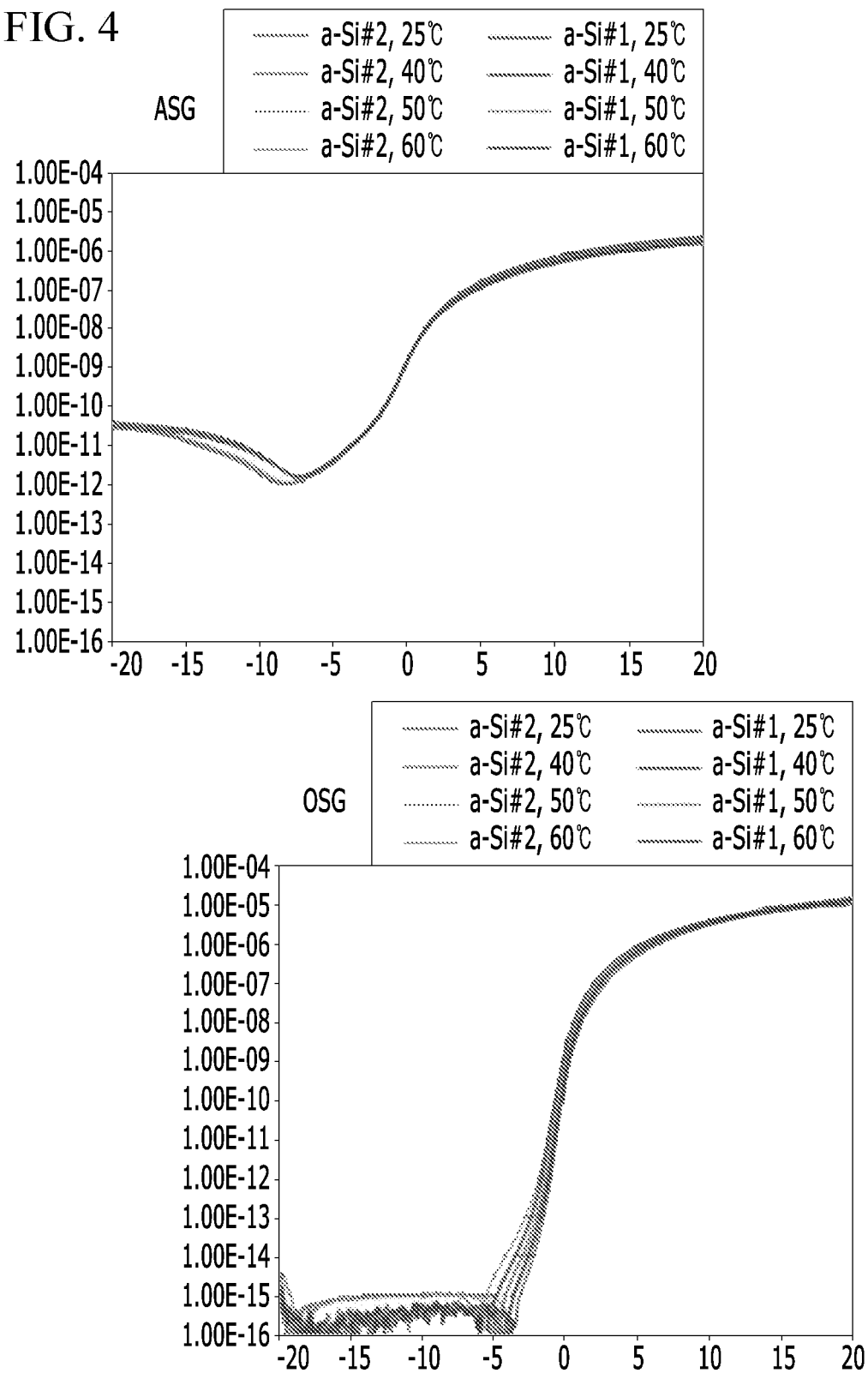
FIG. 4 depicts I-V (current-voltage) curves for a transistor including an amorphous silicon semiconductor and a transistor including an oxide semiconductor.

The difference in the electrical characteristics of the amorphous silicon and the oxide semiconductor will be described with reference to FIG. 4. FIG. 4 depicts I-V (current-voltage) curves for a transistor including an amorphous silicon semiconductor and a transistor including an oxide semiconductor.

In FIG. 4, the left graph (ASG) depicts the I-V curve for an amorphous silicon gate and the right graph (OSG) depicts the I-V curve for an oxide semiconductor gate. As mentioned previously, the oxide semiconductor can include IGZO. In both graphs, the horizontal axis represents the Vgs voltage and the vertical axis represents the value of a current flowing to the channel.

With reference to the left graph (ASG), in the amorphous silicon transistor, the current generally decreases with the voltage Vgs until the voltage Vgs is about −10 V, and increases slightly when the voltage Vgs is further reduced below −10 V. This slight increase in current gives rise to leakage current which causes the transistor performance to deteriorate. Thus, in the amorphous silicon transistor, the voltage Vgs may not be less than a predetermined value (e.g., −10 V). Accordingly, when the voltage applied to the stage is lower than the predetermined value (e.g., −10 V), the driving characteristic of the stage deteriorates.

Referring to the right graph (OSG), in the oxide semiconductor transistor, the current generally decreases with the voltage Vgs until the voltage Vgs is about −5 V, and remains relatively constant when the voltage Vgs is further reduced below −5 V. As a result, the oxide semiconductor transistor is less prone to leakage current than the amorphous silicon transistor at low voltage levels.

Thus, in applications where the voltage Vgs is less than −10 V, the oxide semiconductor (such as IGZO) transistor is preferred over the amorphous silicon transistor.

In the example of FIG. 3, the third low voltage Vss3 and the voltage of the clock signal are assigned a same value of −15 V. By assigning common voltage values to different signals, the number of different voltages generated in the display panel can be reduced, which simplifies the requirements for the driving voltage generator. Since the third low voltage Vss3 and the voltage of the clock signal are less than −10 V, an oxide semiconductor (instead of amorphous silicon) is used as the channel material in the transistors of FIG. 3.

In some embodiments, a region occupied by the gate driver can be reduced since the channel sizes of transistors are smaller when the oxide semiconductor is used as the material in the channel layer, as described below with reference to FIG. 5.

Figure 5:
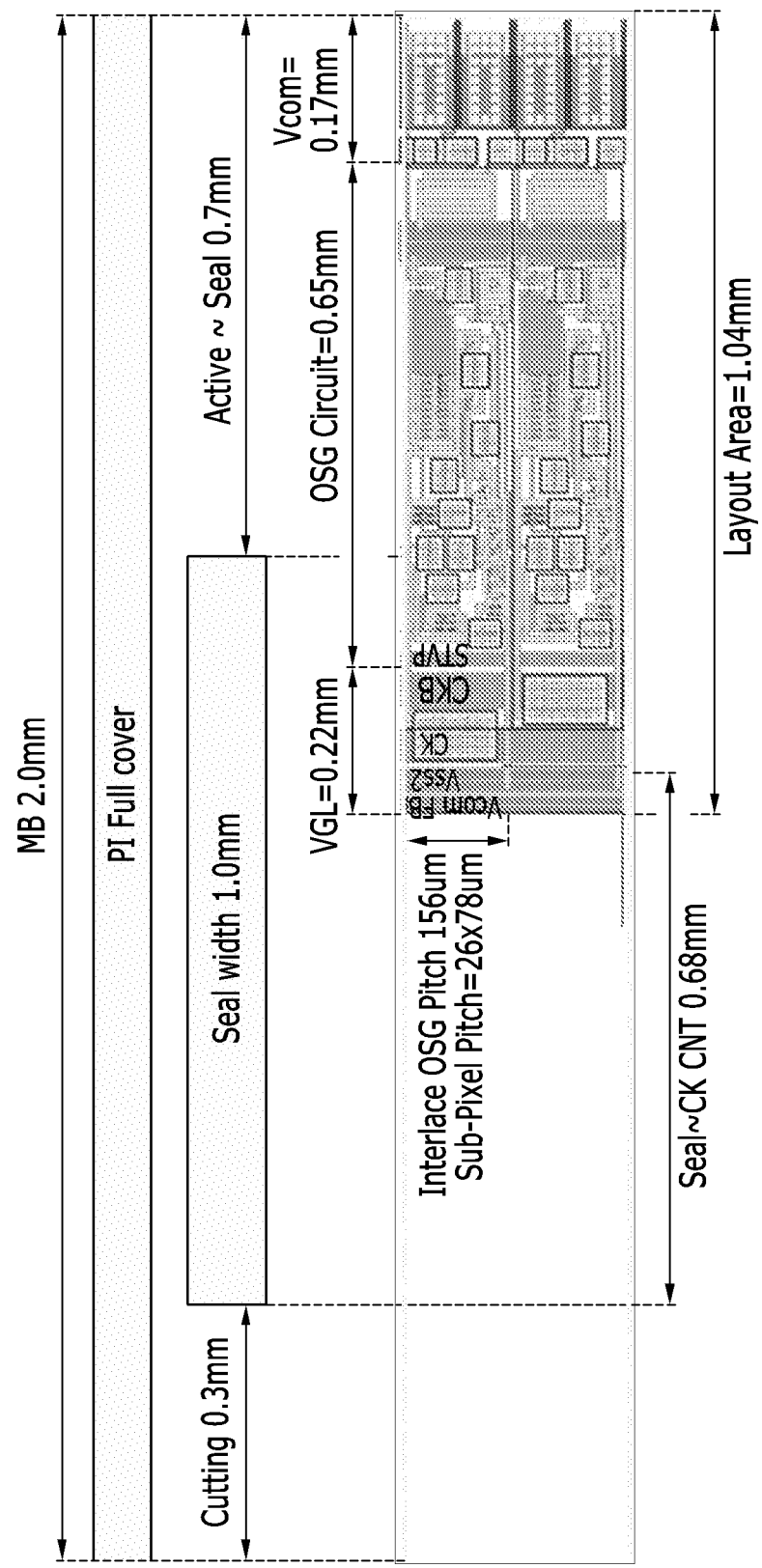
FIG. 5 is a view of the area occupied by a gate driver according to an exemplary embodiment of the inventive concept.

FIG. 5 is a view of the area occupied by a gate driver according to an exemplary embodiment of the inventive concept.

As shown in FIG. 5, a light blocking member BM positioned outside the display area 300 is formed with a width of about 2 mm. The gate driver OSG (incorporating the oxide semiconductor) may be formed with a width of about 0.65 mm. In some embodiments, the width of the light blocking member BM may be further reduced so as to realize a slim bezel.

Figure 6:
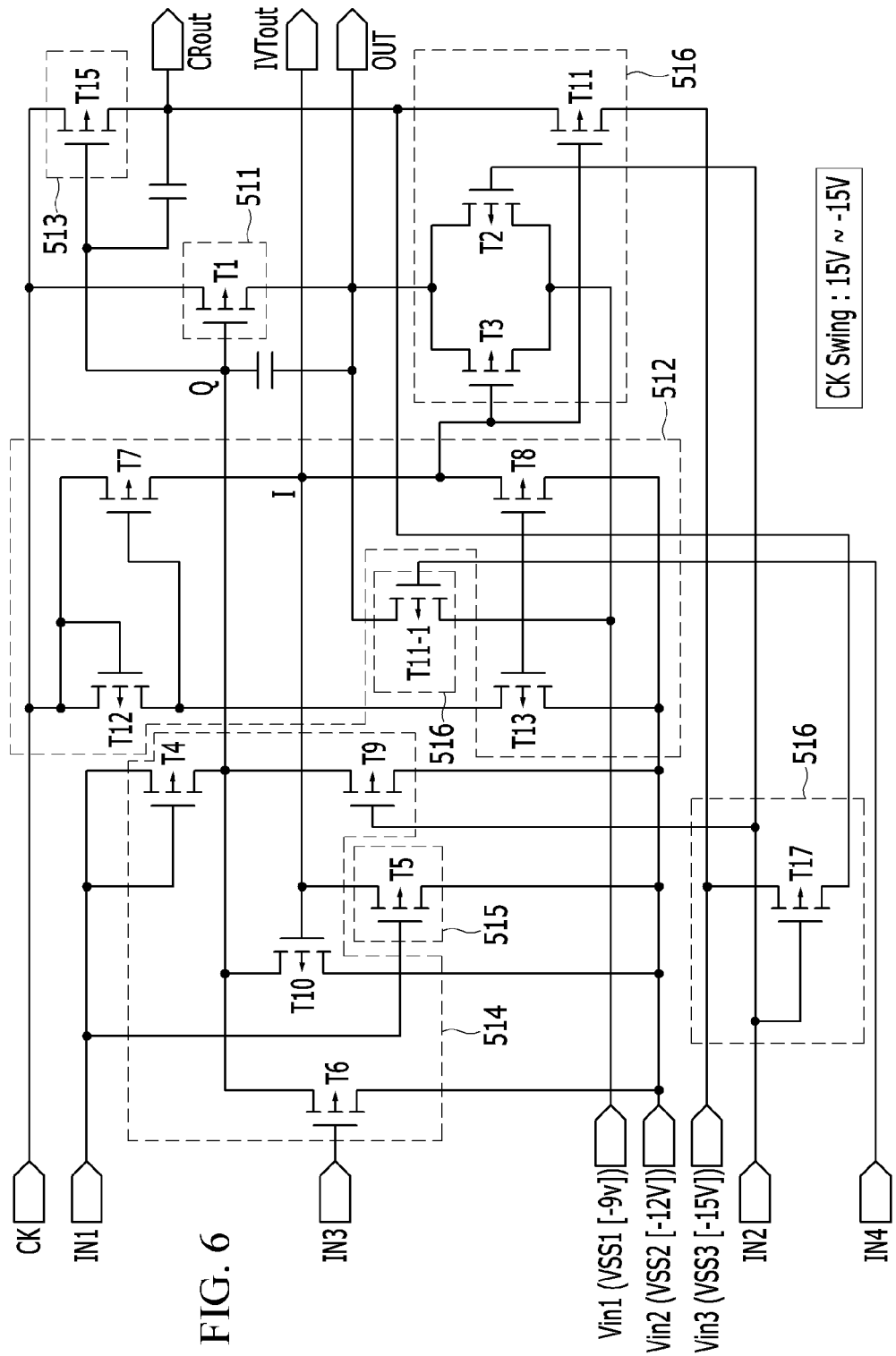
FIG. 6 is a circuit diagram of a stage in a gate driver according to another exemplary embodiment of the inventive concept.

FIG. 6 is a circuit diagram of a stage in a gate driver according to another exemplary embodiment of the inventive concept. The circuit of FIG. 6 is similar to the circuit of FIG. 3, except the levels of the applied voltages VSS1 and VSS2 in FIG. 6 are different from those in FIG. 3.

In the example of FIG. 6, the first low voltage Vss1 is −9 V and the second low voltage Vss2 is −12 V, which are different from the first low voltage Vss1 of −7 V and second low voltage Vss2 of −11 V in FIG. 3. In both FIGS. 3 and 6, the third low voltage Vss3 is −15 V and the voltage of the clock signal is between 15 V and −15 V.

The change in voltage changes the low voltage of the gate-off voltage and the carry signal CR. however the voltage is only decreased in the display panel and images displayed on the display panel are not changed during the driving since those volages are not applied to the inside of pixels. However, in the output of the Q node stabilization unit 514 and the inverter unit 512, the voltage change is generated as follows.

The voltage Vgs is the voltage difference between the source and the gate of each transistor of the Q node stabilization unit 514. When the gate-on voltage is output, the Vgs of the fourth transistor T4 is 0 V, the Vgs of the sixth transistor T6 is −3 V, the Vgs of the ninth transistor T9 is −3 V, and the Vgs of the tenth transistor T10 is 0 V. Also, in the inverter unit 512, the Vgs of the eighth transistor T8 connected to the output terminal is −3 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in leakage current, the voltage of the node Q may be maintained at a constant. As a result, the voltage of the node Q is stabilized.

In the example of FIG. 6, since the lowest applied voltage is −15 V, the oxide semiconductor (such as IGZO) is used as the channel material in the transistors of FIG. 6.

Next, the high temperature reliability of the embodiments in FIGS. 3 and 6 will be described with reference to FIGS. 7 and 8.

Figure 7:
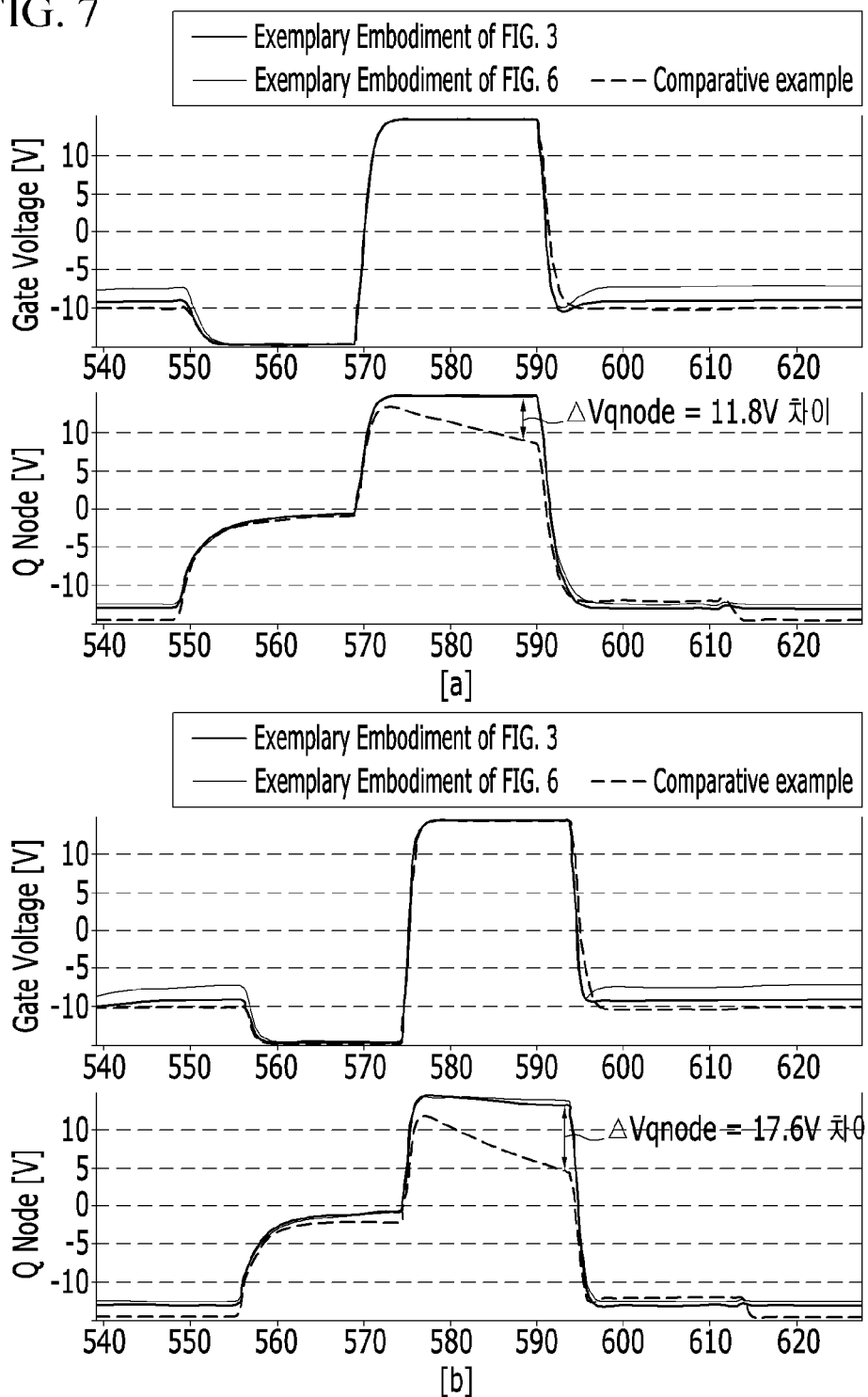

FIGS. 7 and 8 are tables showing the output characteristics of exemplary gate drivers under different operating conditions. Specifically, FIG. 7 shows the change in the gate voltage and the voltage of the node Q with time for the embodiments of FIGS. 3 and 6 as well as a comparative example.

The comparative example is a circuit which does not have a third low voltage Vss3 element. Also, in the comparative example, the second low voltage Vss2 is connected to transistors instead of the third low voltage Vss3.

In FIG. 7 (a), the channel length of the transistor is 7 μm. In FIG. 7 (b), the channel length of the transistor is 3 μm.

Referring to FIGS. 7 (a) and 7 (b), it is observed that the embodiments of FIGS. 3 and 6 and the comparative example have similar gate voltages. However, the comparative example undergoes a decrease in the voltage of the node Q (relative to the embodiments of FIGS. 3 and 6) at certain time intervals. For example, the magnitude of the decrease in voltage of the node Q (ΔVqnode) between the comparative example and the embodiments in FIGS. 3 and 6 is about 11.8 V in FIG. 7 (a) and about 17.6 V in FIG. 7 (b).

The voltage drop of the node Q in the comparative example may impact the generation of the gate voltage. Although the gate voltage in the comparative example can be generated without issues at room temperature, reliability issues may arise when the gate voltage in the comparative example is generated at a high temperature or a low temperature, as described below with reference to FIG. 8.

FIG. 8 shows the high temperature characteristics of the embodiments of FIGS. 3 and 6 and the comparative example.

As shown in FIG. 8, the embodiments of FIGS. 3 and 6 and the comparative example have a typical characteristic of 90% which is more than the reference standard of 80%. In other words, the embodiments of FIGS. 3 and 6 and the comparative example should not experience reliability problems when operated at room temperature.

However, when the threshold voltage Vth is −2 V (negative Vth) and operation is carried out at high temperature, the characteristic of the comparative example drops to about 65% to 70%, which is lower than the reference standard of 80%. Under these operating conditions (negative Vth and high temperature), defects may be generated in the devices in the comparative example, which may then lead to reliability issues. Nonetheless, as shown in the rightmost column in the table of FIG. 8, the long term reliability of the comparative example is still higher than that of the reference standard. Accordingly, the comparative example can still be used so long as it is not subject to high temperature for long periods of time.

Conversely, the operation characteristics of the comparative example may deteriorate under low temperature conditions. To mitigate the low temperature characteristics, an additional circuit can be separately formed (or added) to the comparative example. Accordingly, the characteristics at low temperatures can be improved using a compensation circuit, thereby maintaining the long term reliability of the gate driver.

Next, different embodiments of the inventive concept will be described with reference to FIGS. 9 to 17.

FIGS. 9 to 17 are circuit diagrams of a stage in a gate driver according to different embodiments of the inventive concept.

Figure 9:
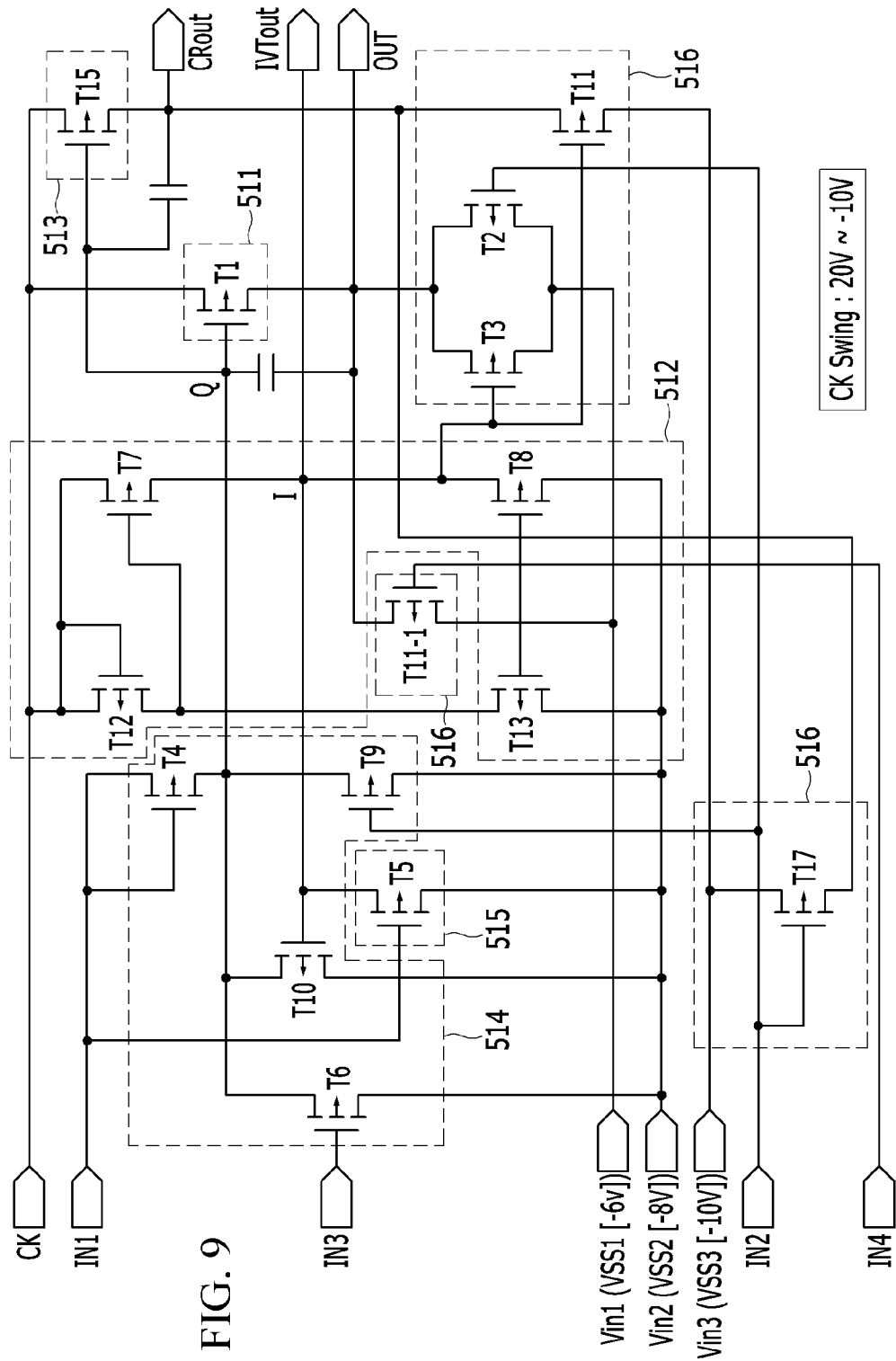
FIGS. 9, 10, 11, 12, 13, 14, 15, 16 and 17 are circuit diagrams of a stage in a gate driver according to different embodiments of the inventive concept.

FIG. 9 is a circuit diagram of a stage in a gate driver according to another exemplary embodiment. Other than the voltage values of the low voltage and the clock signal, the circuit of FIG. 9 is the same as the circuits of FIGS. 3 and 6.

In the example of FIG. 9, the first low voltage Vss1 is −6 V, the second low voltage Vss2 is −8 V, and the third low voltage Vss3 is −10 V. The voltage of the clock signal is between 20 V and −10 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −2 V, the Vgs of the ninth transistor T9 is −2 V, and the Vgs of the tenth transistor T10 is 0 V. Also, the Vgs of the eighth transistor T8 connected to the output terminal in the inverter unit 512 is −2 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 9, since the lowest applied voltage is −10 V, either amorphous silicon or oxide semiconductor may be used as the channel material in the transistors of FIG. 9.

Figure 10:
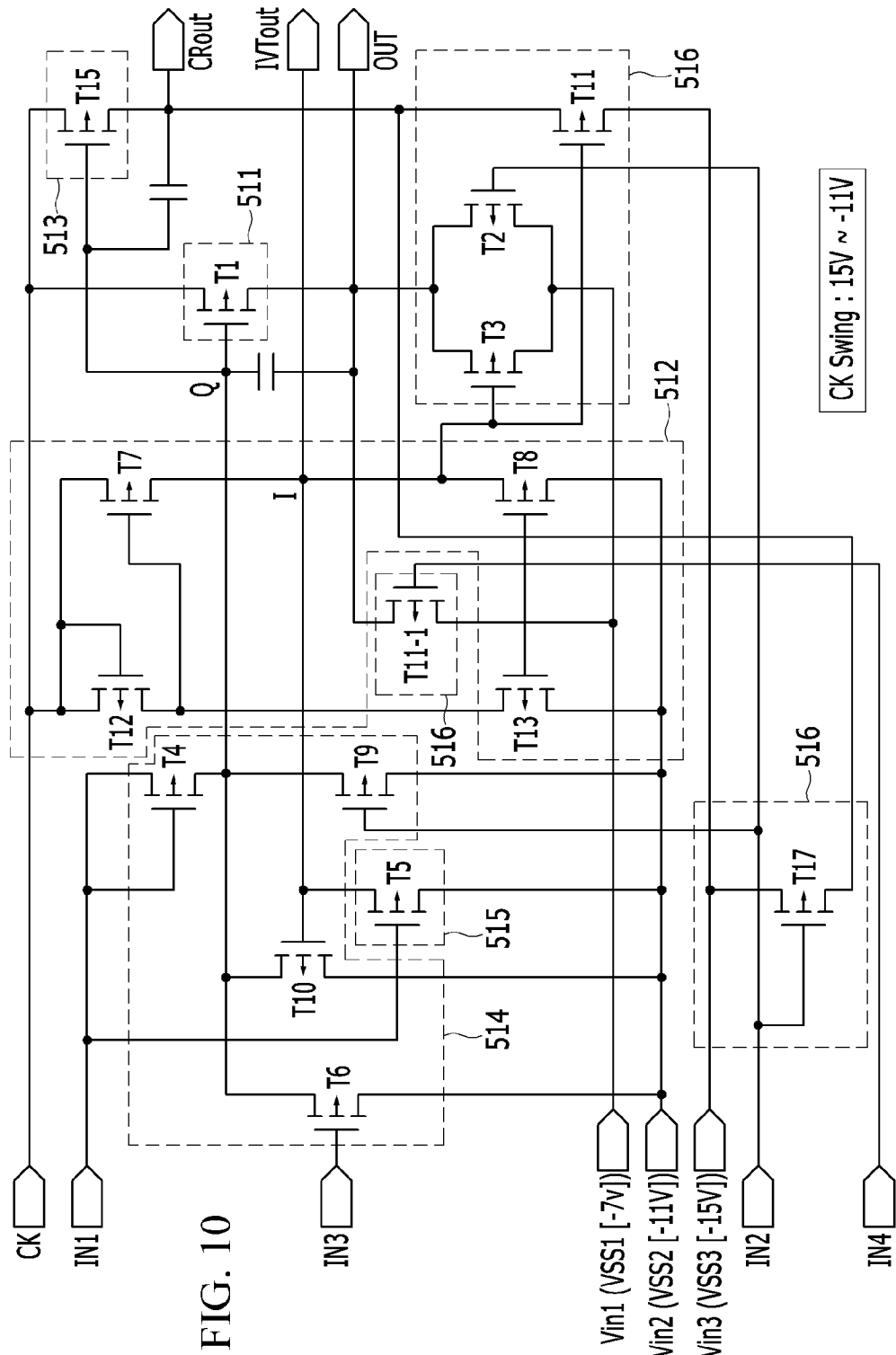

FIG. 10 is a circuit diagram of a stage in a gate driver according to another exemplary embodiment. Other than the levels of the applied voltages, the circuit of FIG. 10 is the same as the circuits of FIGS. 3, 6, and 9.

In the example of FIG. 10, the first low voltage Vss1 is −7 V, the second low voltage Vss2 is −11 V, and the third low voltage Vss3 is −15 V, which are the same as the low voltages in FIG. 3. Unlike FIG. 3, the voltage of the clock signal in FIG. 10 is between 15 V and −11 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is 0 V, the Vgs of the ninth transistor T9 is 0 V, and Vgs of the tenth transistor T10 is 0 V. Also, the Vgs of the eighth transistor T8 connected to the output terminal in the inverter unit 512 is −4 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in leakage current, the voltage of the node Q may be maintained at a constant. As a result, the voltage of the node Q is stabilized.

In the example of FIG. 10, since the lowest applied voltage corresponds to the third low voltage Vss3 of −15 V, the oxide semiconductor is used as the channel material in the transistors of FIG. 10.

Figure 11:
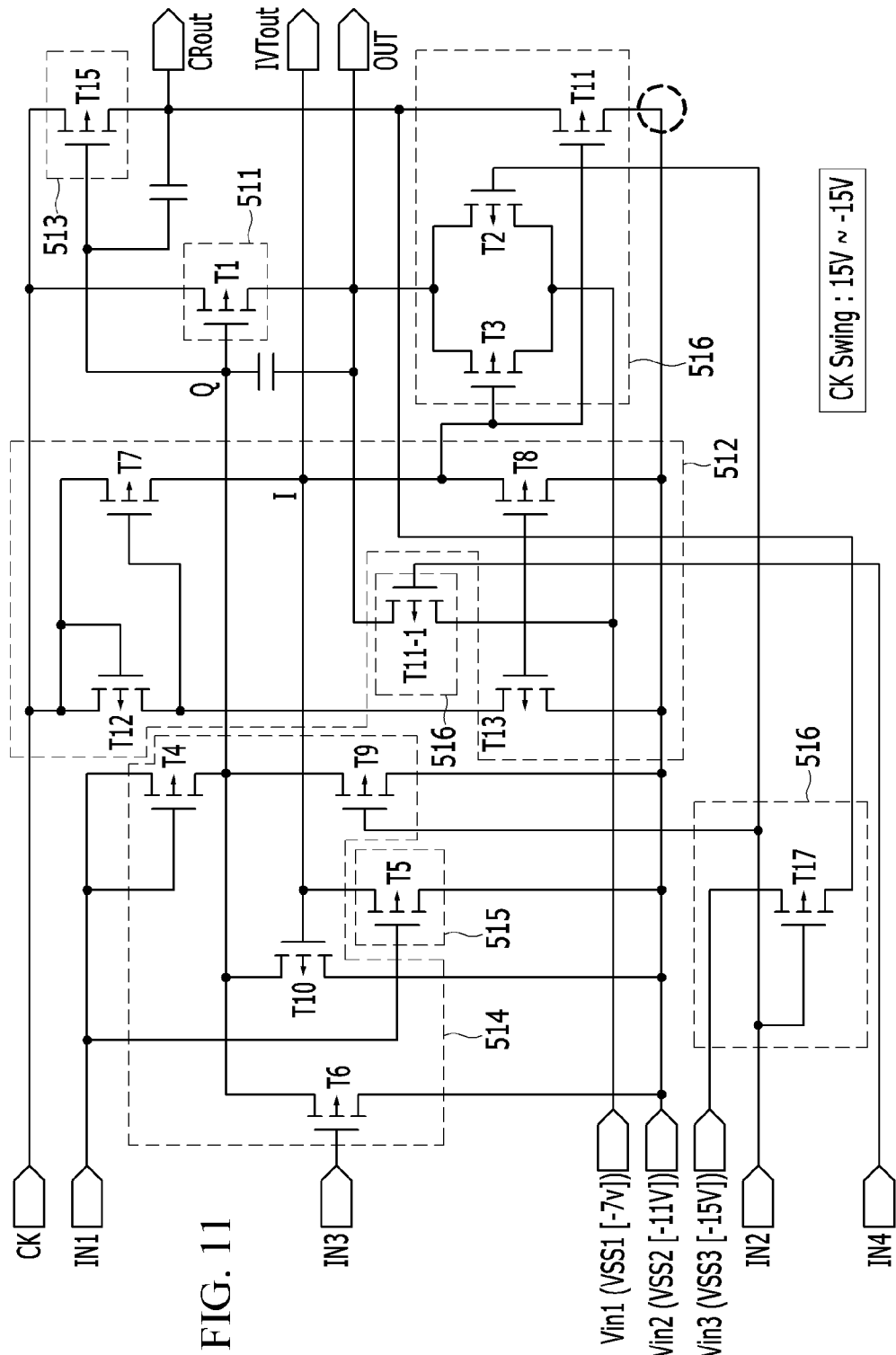

FIG. 11 is a circuit diagram of a stage in a gate driver according to another exemplary embodiment. The circuit of FIG. 11 is different from the circuit of FIG. 3, as described below.

In the example of FIG. 11, the output terminal of the eleventh transistor T11 of the pull-down unit 516 is connected to the second voltage input terminal Vin2. Accordingly, the eleventh transistor T11 changes the voltage of the carry signal output terminal CRout to the second low voltage Vss2 according to the voltage of the node I. The carry signal CR is not applied to an actual pixel. As a result, image display of the pixel is not affected by the change in the level of the low voltage.

In the example of FIG. 11, the first low voltage Vss1 is −7 V, the second low voltage Vss2 is −11 V, and the third low voltage Vss3 is −15 V, which are the same as the low voltages in FIG. 3. Like FIG. 3, the voltage of the clock signal in FIG. 11 is between 15 V and −15 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −4 V, the Vgs of the ninth transistor T9 is −4 V, and the Vgs of the tenth transistor T10 is −4 V. Also, the Vgs of the eighth transistor T8 connected to the output terminal in the inverter unit 512 is 0 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 11, since the lowest applied voltage is −15 V, the oxide semiconductor is used as the channel material in the transistors of FIG. 11.

Figure 12:
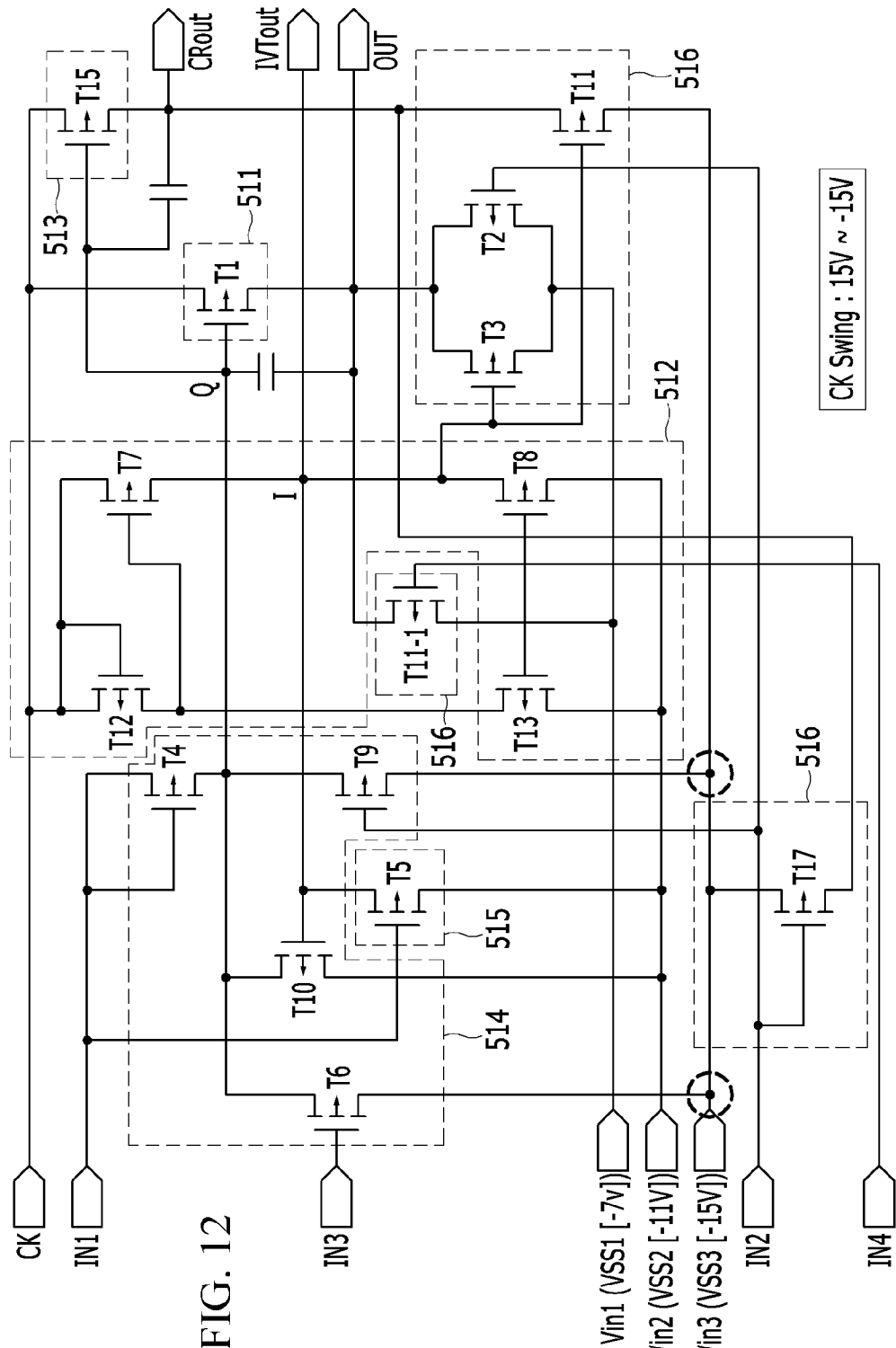

FIG. 12 is a circuit diagram of a stage in a gate driver according to another exemplary embodiment. The circuit of FIG. 12 is different from the circuit of FIG. 3, as described below.

In the example of FIG. 12, the output terminals of the sixth transistor T6 and the ninth transistor T9 of the Q node stabilization unit 514 are connected to the third low voltage Vss3. The control terminal of the sixth transistor T6 is connected to the third input terminal IN3. The input terminal of the sixth transistor T6 is connected to the node Q, and the output terminal of the sixth transistor T6 is connected to the third voltage input terminal Vin3. When the carry signal CR of the second next stage is applied with the high voltage, the sixth transistor T6 changes the voltage of the node Q to the third low voltage Vss3. The control terminal of the ninth transistor T9 is connected to the second input terminal IN2. The input terminal of the ninth transistor T9 is connected to the node Q, and the output terminal of the ninth transistor T9 is connected to the third voltage input terminal Vin3. As a result, when the carry signal CR of the next stage is applied with the high voltage, the voltage of the node Q changes to the third low voltage Vss3. The sixth transistor T6 and the ninth transistor T9 change the node Q to the third low voltage Vss3 (that has a lower voltage level than the second low voltage Vss2). This reduces the leakage current generated in the transistor connected to the node Q and as a result, the voltage of the node Q can be maintained at a constant. Accordingly, the voltage of the node Q is stabilized.

In the example of FIG. 12, the first low voltage Vss1 is −7 V, the second low voltage Vss2 is −11 V, and the third low voltage Vss3 is −15 V, which are the same as the low voltages in FIG. 3. Like FIG. 3, the voltage of the clock signal in FIG. 12 is between 15 V and −15 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is 0 V, the Vgs of the ninth transistor T9 is 0 V, and the Vgs of the tenth transistor T10 is 0 V. Also, the Vgs of the eighth transistor T8 connected to the output terminal in the inverter unit 512 is −4 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in leakage current, the voltage of the node Q may be maintained at a constant. As a result, the voltage of the node Q is stabilized.

In the example of FIG. 12, since the lowest applied voltage is −15 V, the oxide semiconductor is used as the channel material in the transistors of FIG. 12.

Figure 13:
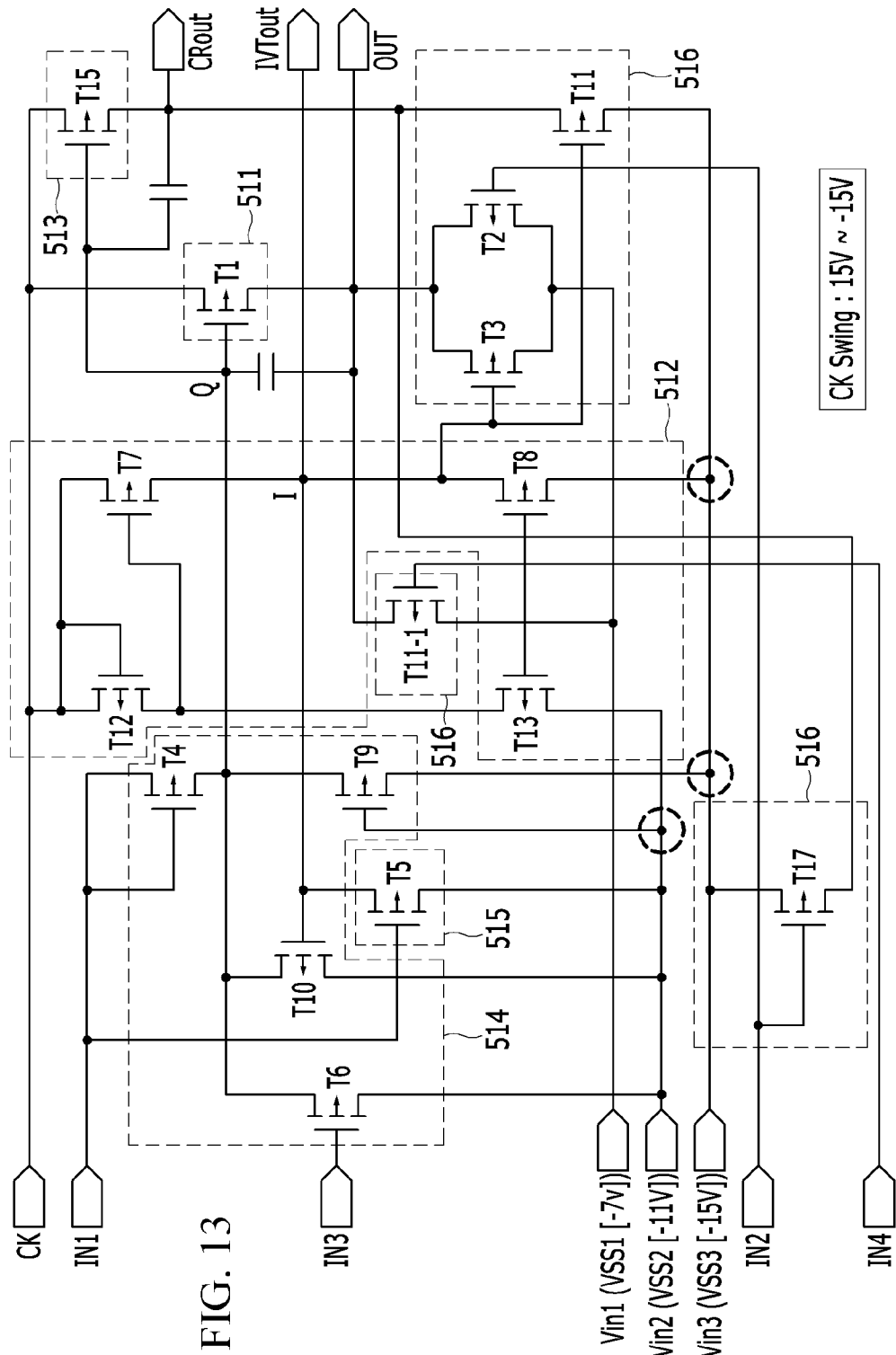

FIG. 13 is a circuit diagram of a stage in a gate driver according to another exemplary embodiment. The circuit in FIG. 13 is different from the circuit in FIG. 3, as described below.

In the example of FIG. 13, the control terminal of the ninth transistor T9 of the Q node stabilization unit 514 is connected to the second low voltage Vss2. The output terminal of the ninth transistor T9 is connected to the third low voltage Vss3. The output terminal of the eighth transistor T8 of the inverter unit 512 is also connected to the third low voltage Vss3.

The control terminal of the ninth transistor T9 is connected to the second voltage input terminal Vin2. The input terminal of the ninth transistor T9 is connected to the node Q, and the output terminal of the ninth transistor T9 is connected to the third voltage input terminal Vin3. By applying the second low voltage Vss2 to the control terminal of the ninth transistor T9, the turn-off state may be continuously maintained, so as to prevent voltage leakage at the node Q. As mentioned above, the output terminal of the eighth transistor T8 is connected to the third low voltage Vss3. The output of the inverter unit 512 is provided at node I which has the third low voltage Vss3 as the low voltage. Thus, when the gate-on voltage is output, the voltage of the node I and the output of the inverter unit 512 are at the third low voltage Vss3. Accordingly, the leakage current can be controlled.

In the example of FIG. 13, the first low voltage Vss1 is −7 V, the second low voltage Vss2 is −11 V, and the third low voltage Vss3 is −15 V, which are the same as the low voltages in FIG. 3. Like FIG. 3, the voltage of the clock signal is between 15 V and −15 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −4 V, the Vgs of the ninth transistor T9 is −4 V, and the Vs of the tenth transistor T10 is −4 V. Also, the Vgs of the eighth transistor T8 connected to the output terminal in the inverter unit 512 is 0 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 13, since the lowest applied voltage is −15V, the oxide semiconductor is used as the channel material in the transistors of FIG. 13.

Figure 14:
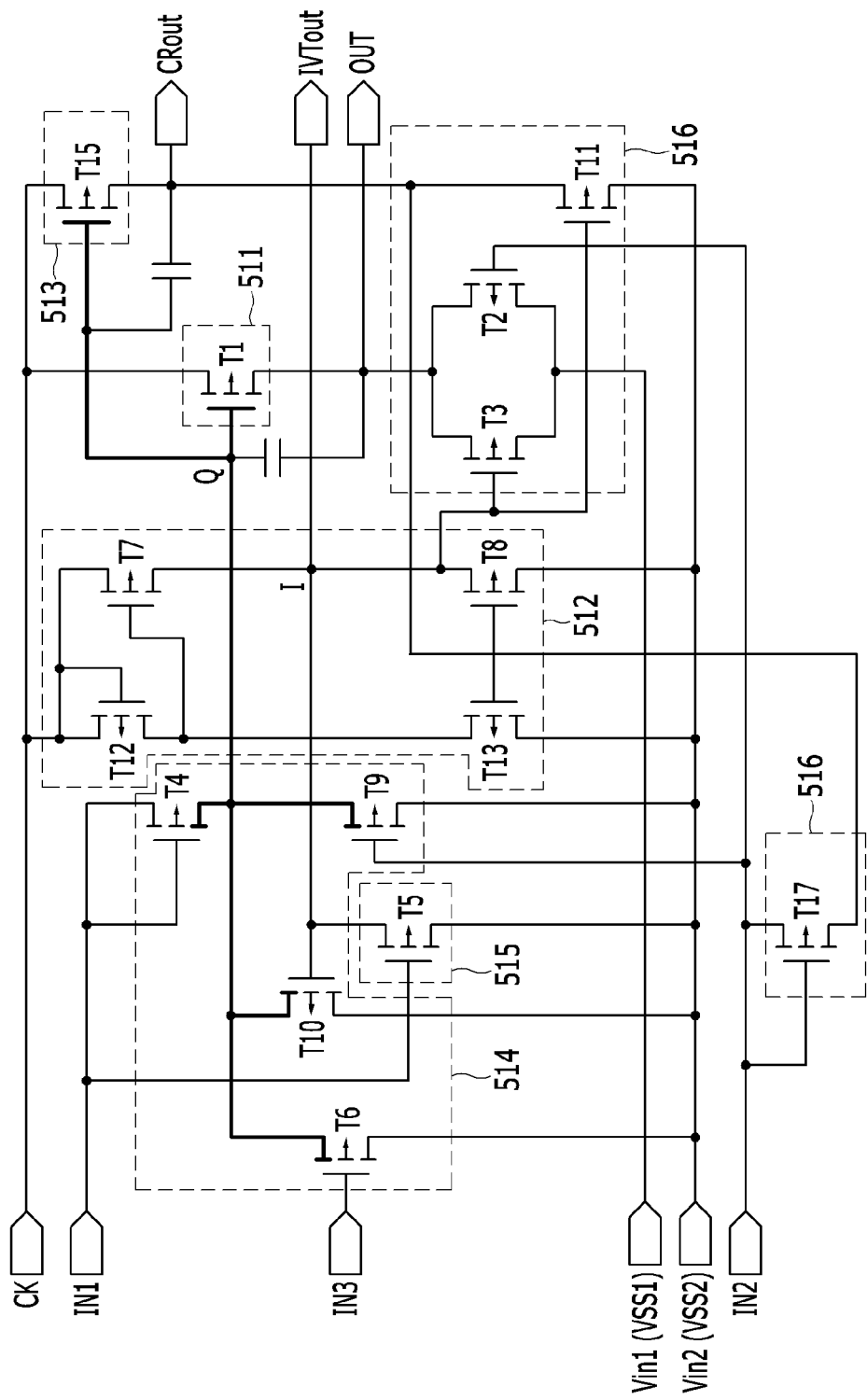
Figure 15:
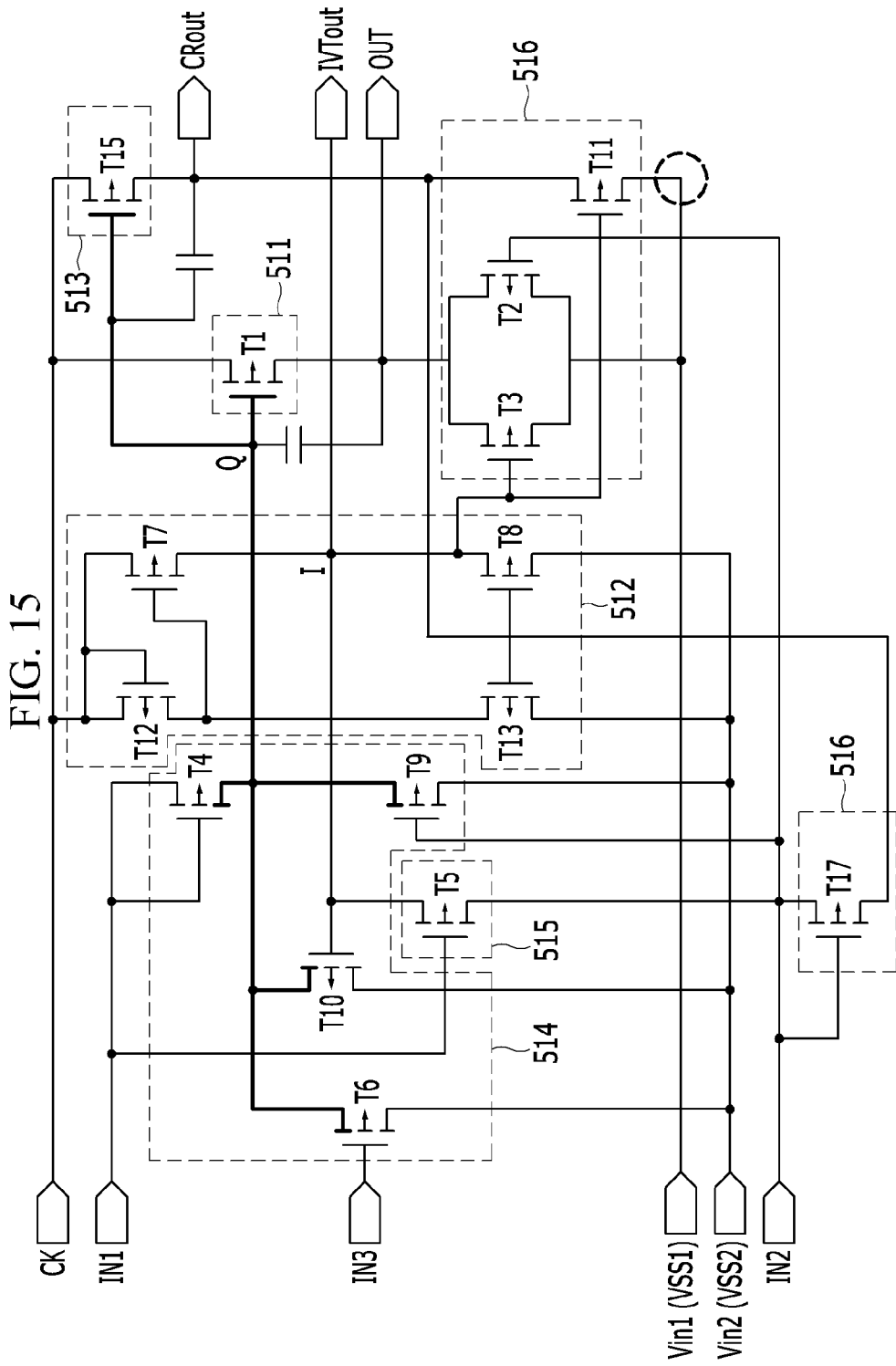

Next, the embodiments of FIGS. 14 and 15 will be described. In the examples of FIGS. 14 and 15, the third voltage input terminal Vin3 applying the third low voltage Vss3 and the wiring connected thereto is removed. As a result, the third low voltage Vss3 is omitted. The eleventh-1 transistor 11-1 is also omitted in the examples of FIGS. 14 and 15.

As described previously in FIG. 3, the output terminals of the eleventh transistor T11 and the seventeenth transistor T17 of the pull-down unit 516 are connected to the third low voltage Vss3. However, in the example of FIG. 14, the output terminal of the eleventh transistor T11 of the pull-down unit 516 is connected to the second low voltage Vss2. The output terminal of the seventeenth transistor T17 of the pull-down unit 516 is not connected to the second low voltage Vss2 in FIG. 14. Accordingly, the low voltage of the carry signal CR is the second low voltage Vss2 in FIG. 14.

Referring back to FIGS. 7 and 8, the comparative example (in which the third low voltage Vss3 is not applied) was described. Since the low voltage Vss3 is not applied in FIG. 14, the example of FIG. 14 may include operation characteristics similar to those of the comparative example described in FIGS. 7 and 8. For example, operating the embodiment of FIG. 14 at high temperature may cause the operation characteristics to deteriorate. Thus, in order to maintain long term reliability, the exemplary embodiment of FIG. 14 is preferably operated at room temperature conditions.

It is noted that the example of FIG. 14 can include different first and second low voltages. Also, the voltage of the clock signal in the example of FIG. 14 may be the same as (or different from) the voltages of the clock signal described in the other embodiments.

In the example of FIG. 14, the first low voltage Vss1 is −5 V, the second low voltage Vss2 is −10 V, and the voltage of the clock signal is between 15 V and −15 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −5 V, the Vgs of the ninth transistor T9 is −5 V, and the Vgs of the tenth transistor T10 is 0 V. Also, the Vgs of the eighth transistor T8 connected to the output terminal in the inverter unit 512 is 0 V.

As shown above, the Vgs voltage of the fourth transistor T4, the sixth transistor T6, ninth transistor T9 and the tenth transistor T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 14, since the lowest applied voltage is −15 V, the oxide semiconductor is used as the channel material in the transistors of FIG. 14.

FIG. 15 is a circuit diagram of a stage in a gate driver according to another exemplary embodiment. The circuit of FIG. 15 is different from the circuit of FIG. 14, in that the output terminal of the eleventh transistor T11 in FIG. 15 is connected to the first low voltage Vss1.

In the example of FIG. 15, the first low voltage Vss1 is −5 V, the second low voltage Vss2 is −10 V, and the voltage of the clock signal is between 15 V and −15 V, which are the same as the example of FIG. 14.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −5 V, the Vgs of the ninth transistor T9 is −4 V, and the Vgs of the tenth transistor T10 is 0 V. Also, the Vgs of the eighth transistor T8 connected to the output terminal in the inverter unit 512 is −5 V.

In the example of FIG. 15, the voltage leakage at the node I (the output of the inverter unit 512) is decreased when the Vgs of the eighth transistor T8 is reduced.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 15, since the lowest applied voltage is −15 V, the oxide semiconductor is used as the channel material in the transistors of FIG. 15.

Figure 16:
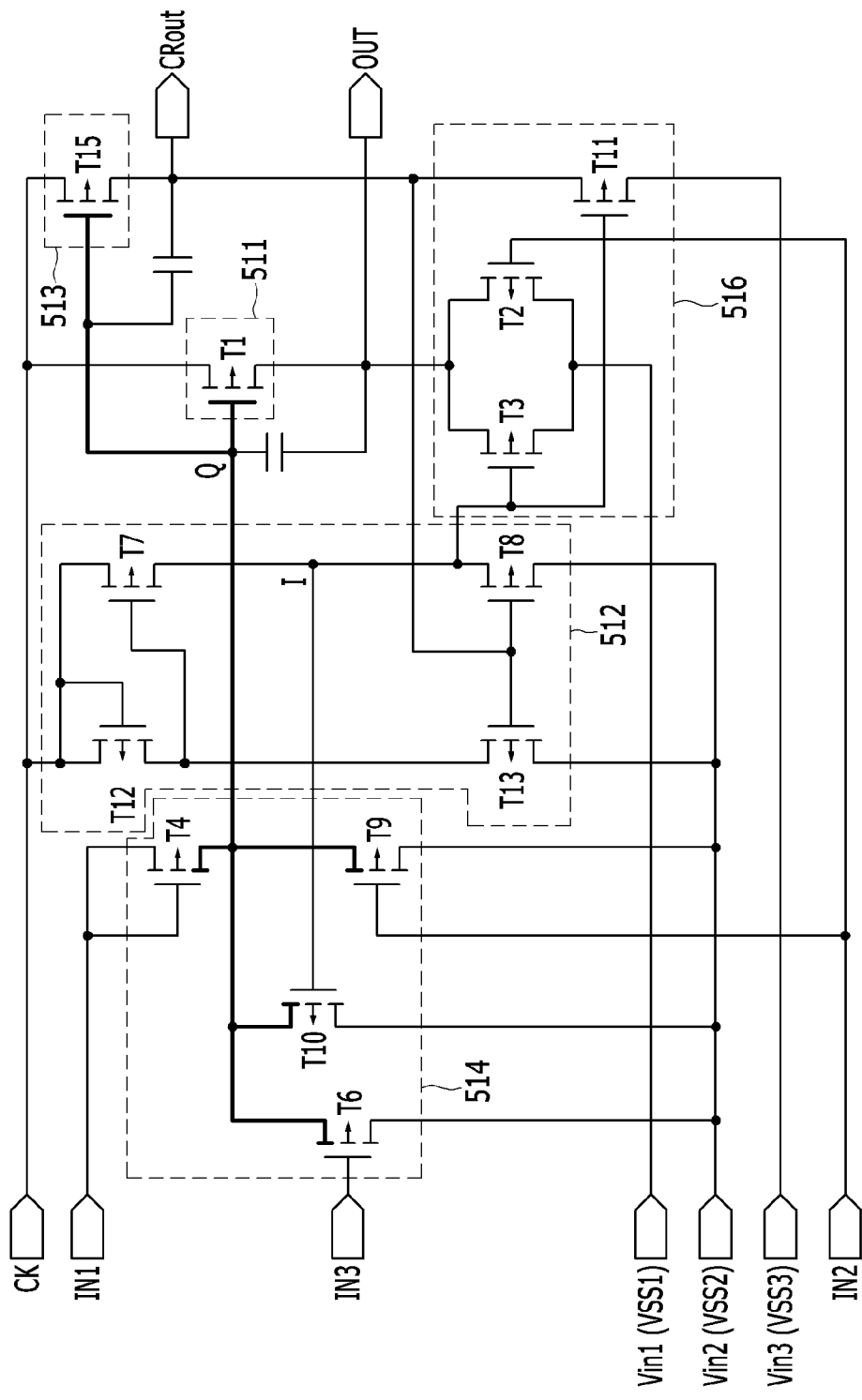

FIG. 16 is a circuit diagram of a stage in a gate driver according to another exemplary embodiment.

The output unit 511, the inverter unit 512, the carry signal generator 513, and the Q node stabilization unit 514 in FIG. 16 are the same as those described in FIG. 3. Unlike FIG. 3, the fifth transistor T5 forming the I node stabilization unit 515 and the eleventh-1 transistor T11-1 and the seventeenth transistor T17 forming the pull-down unit 516 are omitted in the example of FIG. 16.

Referring to FIG. 16, the pull-down unit 516 includes three transistors (the second transistor T2, the third transistor T3, and the eleventh transistor T11) connected to the output unit 511 and the output terminal of the carry signal generator 513. The control terminal of the second transistor T2 is connected to the second input terminal IN2. The input terminal of the second transistor T2 is connected to the gate voltage output terminal OUT, and the output terminal of the second transistor T2 is connected to the first voltage input terminal Vin1. The second transistor T2 changes the voltage of the gate voltage output terminal OUT to the first low voltage Vss1 according to the next stage carry signal CR. The control terminal of the third transistor T3 is connected to the node I. The input terminal of the third transistor T3 is connected to the gate voltage output terminal OUT, and the output terminal of the third transistor T3 is connected to the first voltage input terminal Vin1. The third transistor T3 changes the voltage of the gate voltage output terminal OUT to the first low voltage Vss1 according to the voltage of the node I. The control terminal of the eleventh transistor T11 is connected to the node I. The input terminal of the eleventh transistor T11 is connected to the carry signal output terminal CRout, and the output terminal of the eleventh transistor T11 is connected to the third voltage input terminal Vin3. The eleventh transistor T11 changes the voltage of the carry signal output terminal CRout to the third low voltage Vss3 according to the voltage of the node I.

In the example of FIG. 16, the first low voltage Vss1 is −5 V, the second low voltage Vss2 is −10 V, and the third low voltage Vss3 is −15 V. The voltage of the clock signal is between 15 V and −15 V.

The Vgs voltage is the voltage difference between the source and the gate of each transistor of the Q node stabilization unit 514. When the gate-on voltage is output, the Vgs of the fourth transistor T4 is 0 V, the Vgs of the sixth transistor T6 is −5 V, the Vgs of the ninth transistor T9 is −5 V, and the Vgs of the tenth transistor T10 is 0 V. Also, the Vgs of the eighth transistor T8 connected to the output terminal in the inverter unit 512 is −5 V.

As shown above, the Vgs voltages of the fourth transistor T4, the sixth transistor T6, ninth transistor T9 and the tenth transistor T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 16, since the lowest applied voltage is −15 V, the oxide semiconductor is used as the channel material in the transistors of FIG. 16.

As mentioned previously, the voltage level in the example of FIG. 16 can be modified. If the lowest applied voltage in the example of FIG. 16 is changed to −10 V, amorphous silicon (instead of the oxide semiconductor) may be used as the channel material in the transistors of FIG. 16.

Figure 17:
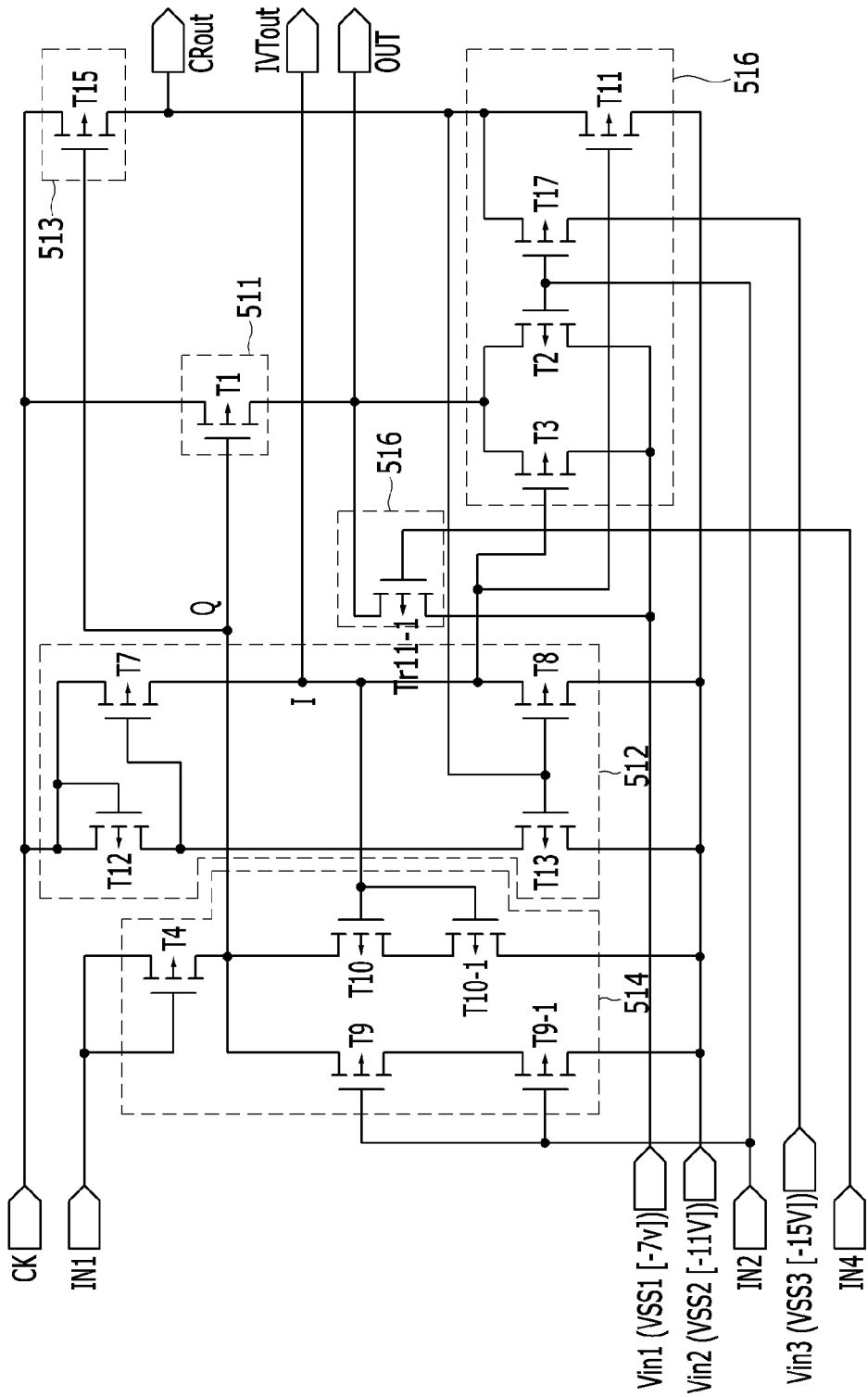

FIG. 17 is a circuit diagram of a stage in a gate driver according to another exemplary embodiment.

The output unit 511, the inverter unit 512, and the carry signal generator 513 in FIG. 17 are the same as those described in FIG. 3. Unlike FIG. 3, the fifth transistor T5 forming the I node stabilization unit 515 is omitted and the connections of the seventeenth transistor T7 of the pull-down unit 516 are modified in the example of FIG. 17. The structure of the Q node stabilization unit 514 in FIG. 17 is also different from that of FIG. 3.

Since the output unit 511, inverter unit 512, and carry signal generator 513 in FIG. 17 are the same as those described previously in FIG. 3, detailed description of the aforementioned elements shall be omitted.

Referring to FIG. 17, the Q node stabilization unit 514 includes five transistors (the fourth transistor T4, the ninth transistor T9, the ninth-1 transistor T9-1, the tenth transistor T10, and the tenth-1 transistor T10-1). The input terminal and the control terminal of the fourth transistor T4 are commonly connected to the first input terminal IN1 (by a diode connection), and the output terminal of the fourth transistor T4 is connected to the node Q. When the high voltage is applied to the first input terminal IN1, the fourth transistor T4 applies the high voltage to the node Q.

The ninth and ninth-1 transistors T9 and T9-1 form a pair of transistors in which an input terminal and an output terminal of the transistors are connected to each other and the control terminals are connected to a same terminal. As shown in FIG. 17, the output terminal of the ninth transistor T9 is connected to the input terminal of the ninth-1 transistor T9-1. The control terminals of the ninth and ninth-1 transistors T9 and T9-1 are connected to the second input terminal IN2. The input terminal of the ninth transistor T9 is connected to the node Q. The output terminal of the ninth-1 transistor T9-1 is connected to the second voltage input terminal Vin2. By using a pair of connection transistors, the two transistors divide the voltage (particularly the low voltage) difference between the second low voltage and the carry signal of the next stage to be applied, such that leakage current at the node Q is minimized. In some embodiments, the ninth and ninth-1 transistors T9 and T9-1 may be formed having a structure in which at least three additional thin film transistors are connected. In those embodiments, the input terminals and the output terminals of the additional transistors may be connected to each other, and the control terminals of the additional transistors may be connected to the same second input terminal IN2.

In some embodiments, the tenth and tenth-1 transistors T10 and T10-1 form a pair of transistors in which an input terminal and an output terminal of the transistors are connected to each other and the control terminals are connected to a same terminal. As shown in FIG. 17, the output terminal of the tenth transistor T10 is connected to the input terminal of the tenth-1 transistor T10-1. The control terminals of the tenth and tenth-1 transistors T10 and T10-1 are connected to the node I. The input terminal of the tenth transistor T10 is connected to the node Q, and the output terminal of the tenth-1 transistor T10-1 is connected to the second voltage input terminal Vin2. The tenth and the tenth-1 transistors T10 and T10-1 change the voltage of the node Q to the second low voltage Vss2 according to the voltage of the node I. By using a pair of connection transistors, the two transistors divide the voltage difference between the second low voltage and the node I to be applied, such that leakage current at the node Q is minimized. In some embodiments, the tenth and tenth-1 transistors T9 and T9-1 may be formed having a structure in which at least additional three thin film transistors are connected. In those embodiments, the input terminals and the output terminals of the additional transistors may be connected to each other, and the control terminals of the additional transistors may be connected to the same node I.

When the fourth transistor T4, ninth transistor T9, ninth-1 transistor T9-1, tenth transistor T10, and tenth-1 transistor T10-1 are connected to the node Q the voltage of the node Q is stabilized in each time period.

The pull-down unit 516 in FIG. 17 is described as follows.

The pull-down unit 516 includes five transistors (the second transistor T2, the third transistor T3, the eleventh transistor T11, the eleventh-1 transistor T11-1, and the seventeenth transistor T17) connected to the output unit 511 and the output terminal of the carry signal generator 513.

The control terminal of the second transistor T2 is connected to the second input terminal IN2. The input terminal of the second transistor T2 is connected to the gate voltage output terminal OUT, and the output terminal of the second transistor T2 is connected to the first voltage input terminal Vin1. The second transistor T2 changes the voltage of the gate voltage output terminal OUT to the first low voltage Vss1 according to the carry signal CR of the next stage. The control terminal of the third transistor T3 is connected to the node I. The input terminal of the third transistor T3 is connected to the gate voltage output terminal OUT, and the output terminal of the third transistor T3 is connected to the first voltage input terminal Vin1. The third transistor T3 changes the voltage of the gate voltage output terminal OUT to the first low voltage Vss1 according to the voltage of the node I. The control terminal of the eleventh transistor T11 is connected to the node I. The input terminal of the eleventh transistor T11 is connected to the carry signal output terminal CRout, and the output terminal of the eleventh transistor T11 is connected to the second voltage input terminal Vin2. The eleventh transistor T11 changes the voltage of the carry signal output terminal CRout to the second low voltage Vss2 according to the voltage of the node I. The control terminal of the eleventh-1 transistor T11-1 is connected to the fourth input terminal IN4. The input terminal of the eleventh-1 transistor T11-1 is connected to the gate voltage output terminal OUT, and the output terminal of the eleventh-1 transistor T11-1 is connected to the first voltage input terminal Vin1. The eleventh-1 transistor T11-1 changes the gate voltage to the first low voltage Vss1 when the inverter output signal of the previous stage is applied with the high voltage. The control terminal of the seventeenth transistor T17 is connected to the second input terminal IN2. The input terminal of the seventeenth transistor T17 is connected to the carry signal output terminal CRout, and the output terminal of the seventeenth transistor T17 is connected to the third voltage input terminal Vin3. The seventeenth transistor T17 changes the voltage of the carry signal output terminal CRout to the third low voltage Vss3 based on the next stage carry signal CR.

In the example of FIG. 17, the first low voltage Vss1 is −5 V, the second low voltage Vss2 is −10 V, and the third low voltage Vss3 is −15 V. The voltage of the clock signal is between 15 V and −10 V.

The Vgs voltage is the voltage difference between the source and the gate of each transistor of the Q node stabilization unit 514. When the gate-on voltage is output, the Vgs of the fourth transistor T4 is 0 V, the Vgs of the ninth and ninth-1 transistors T9 and T9-1 is −5 V, and the Vgs of the tenth and tenth-1 transistors T10 and T10-1 is 0 V. Also, the Vgs of the eighth transistor T8 connected to the output terminal in the inverter unit 512 is −5 V.

As shown above, the Vgs voltages of the fourth transistor T4, the ninth and ninth-1 transistors T9 and T9-1 and the tenth and tenth-1 transistors T10 have a value of equal to or less than 0 V, so as to generate and output the gate-on voltage in the corresponding stage. Since there is no increase in the leakage current, the voltage of the node Q may be maintained at a constant. As a result, the voltage of the node Q is stabilized.

In the example of FIG. 17, since the lowest applied voltage is −10 V, either amorphous silicon or oxide semiconductor may be used as the channel material in the transistors of FIG. 17.

Depending on the level of the applied voltages, the above-described embodiments may use amorphous silicon or an oxide semiconductor (such as IGZO) as the channel material in the transistors. As mentioned previously, when the lowest applied voltage is greater than −10 V, either amorphous silicon or oxide semiconductor may be used as the channel material in the transistors. However, if the lowest applied voltage is less than −10 V, the oxide semiconductor is then used as the channel material in the transistors.

While this inventive concept has been described in connection with what is presently considered to be practical exemplary embodiments, it is to be understood that the inventive concept is not limited to the disclosed embodiments, but further includes various modifications and equivalent arrangements within the spirit and scope of the present disclosure.

What is claimed is:

1. A display panel comprising: a display area comprising gate lines and data lines; and
    a gate driver connected to the gate lines and comprising a plurality of stages,
    wherein a stage of the plurality of stages comprises: a carry signal generator outputs a carry signal to a carry signal output terminal connected to a first input terminal of a next stage;
    an output unit outputs a gate voltage to a gate voltage output terminal connected to a gate line; and
    an inverter unit outputs an inverter signal to an inverter signal output terminal connected to a fourth input terminal of the next stage, and
    wherein the carry signal output terminal is connected to a second input terminal of a previous stage.

2. A display panel of claim 1, wherein the carry signal output terminal is connected to a third input terminal of a second previous stage.

3. A display panel comprising:
    a display area comprising gate lines and data lines; and
    a gate driver connected to the gate lines and comprising a plurality of stages,
    wherein a stage of the plurality of stages comprises:
    a carry signal generator outputs a carry signal to a carry signal output terminal connected to a first input terminal of a next stage;
    an output unit outputs a gate voltage to a gate voltage output terminal connected to a gate line; and
    an inverter unit outputs an inverter signal to an inverter signal output terminal connected to a fourth input terminal of the next stage,
    wherein the output unit comprises a first transistor and a first capacitor, wherein the first transistor includes an input terminal for receiving a clock signal, a control terminal connected to a node Q, and an output terminal connected to the gate voltage output terminal to output a gate voltage at a first low voltage,
    the inverter unit configured to output voltage at a second low voltage,
    the carry signal generator configured to generate the carry signal at a third low voltage,
    wherein the second low voltage has a lower voltage level than the first low voltage, and the third low voltage has a lower voltage level than the second low voltage.

4. The display panel of claim 3, wherein the stage further comprises a Q node stabilization unit, and a Vgs voltage of a transistor in the Q node stabilization unit has a value of equal to or less than 0 V when the output unit outputs a gate-on voltage.

5. The display panel of claim 4, wherein the Q node stabilization unit comprises: a fourth transistor comprising an input terminal and a control terminal for receiving a carry signal of a previous stage through a first input terminal, and an output terminal connected to the node Q;
    a sixth transistor comprising a control terminal for receiving a carry signal of a second next stage through a third input terminal, an input terminal connected to the node Q, and an output terminal for receiving the second low voltage;
    a ninth transistor comprising a control terminal for receiving a carry signal of the next stage through a second input terminal, an input terminal connected to the node Q, and an output terminal for receiving the second low voltage; and
    a tenth transistor comprising a control terminal connected to a node I wherein the node I connected to the inverter signal output terminal, an input terminal connected to the node Q, and an output terminal for receiving the second low voltage.

6. The display panel of claim 4, wherein the Q node stabilization unit comprises: a fourth transistor comprising an input terminal and a control terminal for receiving a carry signal of a previous stage through a first input terminal, and an output terminal connected to the node Q;
    a sixth transistor comprising a control terminal for receiving a carry signal of a second next stage through a third input terminal, an input terminal connected to the node Q, and an output terminal for receiving the third low voltage;
    a ninth transistor comprising a control terminal for receiving a carry signal of a next stage through a second input terminal, an input terminal connected to the node Q, and an output terminal for receiving the third low voltage; and
    a tenth transistor comprising a control terminal connected to a node I wherein the node I connected to the inverter signal output terminal, an input terminal connected to the node Q, and an output terminal for receiving the second low voltage.

7. The display panel of claim 4, wherein the Q node stabilization unit comprises: a fourth transistor comprising an input terminal and a control terminal for receiving a carry signal of a previous stage through a first input terminal, and an output terminal connected to the node Q;

a sixth transistor comprising a control terminal for receiving a carry signal of a second next stage through a third input terminal, an input terminal connected to the node Q, and an output terminal for receiving the second low voltage;

a ninth transistor comprising a control terminal for receiving the second low voltage, an input terminal connected to the node Q, and an output terminal for receiving the third low voltage; and a tenth transistor comprising a control terminal connected to a node I wherein the node I connected to the inverter signal output terminal, an input terminal connected to the node Q, and an output terminal for receiving the second low voltage.

8. The display panel of claim 4, wherein the Q node stabilization unit comprises: a fourth transistor comprising an input terminal and a control terminal for receiving a carry signal of a previous stage through a first input terminal, and an output terminal connected to the node Q;

a ninth transistor and a ninth-1 transistor comprising a pair of transistors wherein an input terminal of the ninth-1 transistor and an output terminal of the ninth transistor are connected to each other, control terminals of the pair of transistors are connected to a second input terminal for receiving the carry signal of the next stage through a second input terminal, an input terminal of the ninth transistor is connected to the node Q, and an output terminal of the ninth-1 transistor for receiving the second low voltage; and a tenth transistor and a tenth-1 transistor comprising a pair of transistors wherein an input terminal of the tenth-1 transistor and an output terminal of the tenth transistor are connected to each other, control terminals of the pair of transistors are connected to a node I wherein the node I connected to the inverter signal output terminal, an input terminal of the tenth transistor is connected to the node Q, and an output terminal of the tenth-1 transistor for receiving the second low voltage.

9. The display panel of claim 4, further comprising a fifth transistor comprising an input terminal connected to a node I wherein the node I connected to the inverter signal output terminal, a control terminal for receiving a carry signal of a previous stage through a first input terminal, and an output terminal for receiving the second low voltage.

10. The display panel of claim 4, further comprising a pull-down unit comprising a second transistor and a third transistor for decreasing a voltage of the output terminal of the first transistor of the output unit to the first low voltage.

11. The display panel of claim 10, wherein the pull-down unit comprises an eleventh transistor for decreasing a voltage of the carry signal to the third low voltage, and the eleventh transistor comprises a control terminal connected to a node I wherein the node I connected to the inverter signal output terminal, an input terminal connected to the carry signal output terminal, and an output terminal for receiving the third low voltage.

12. The display panel of claim 10, wherein the pull-down unit comprises a seventeenth transistor for decreasing a voltage of the carry signal to the third low voltage, and the seventeenth transistor comprises a control terminal for receiving a carry signal of the next stage through a second input terminal, an input terminal connected to the carry signal output terminal, and an output terminal for receiving the third low voltage.

13. The display panel of claim 10, wherein the pull-down unit further comprises an eleventh-1 transistor for decreasing the gate voltage to the first low voltage, and the eleventh-1 transistor comprises a control terminal for receiving an inverter signal of a previous stage, an input terminal connected to the gate voltage output terminal, and an output terminal for receiving the first low voltage.

14. The display panel of claim 10, wherein the pull-down unit further comprises an eleventh transistor for decreasing a voltage of the carry signal to the second low voltage, and the eleventh transistor comprises a control terminal connected to a node I wherein the node I connected to the inverter signal output terminal, an input terminal connected to the carry signal output terminal, and an output terminal for receiving the second low voltage.

15. The display panel of claim 10, wherein the pull-down unit further comprises an eleventh transistor for decreasing a voltage of the carry signal to the first low voltage, and the eleventh transistor comprises a control terminal connected to a node I wherein the node I connected to the inverter signal output terminal, an input terminal connected to the carry signal output terminal, and an output terminal for receiving the first low voltage.

16. The display panel of claim 10, wherein a channel of the transistors comprises an oxide semiconductor or an amorphous semiconductor, and when a voltage applied to each stage is more than −10 V, either the amorphous semiconductor or the oxide semiconductor is used to form the channel of the transistors, and when the voltage applied to each stage is less than −10 V, the oxide semiconductor is used to form the channel of the transistors.

* * * * *